US008731949B2

(12) United States Patent
Jiang et al.

(10) Patent No.: US 8,731,949 B2
(45) Date of Patent: May 20, 2014

(54) METHOD AND SYSTEM FOR AUDIO ENCODING AND DECODING AND METHOD FOR ESTIMATING NOISE LEVEL

(75) Inventors: Dongping Jiang, Shenzhen (CN); Hao Yuan, Shenzhen (CN); Ke Peng, Shenzhen (CN); Guoming Chen, Shenzhen (CN); Jiali Li, Shenzhen (CN)

(73) Assignee: ZTE Corporation (CN)

( * ) Notice: Subject to any disclaimer, the term of this patent is extended or adjusted under 35 U.S.C. 154(b) by 515 days.

(21) Appl. No.: 13/173,367

(22) Filed: Jun. 30, 2011

(65) Prior Publication Data
US 2013/0006645 A1    Jan. 3, 2013

(51) Int. Cl.
*G10L 19/00* (2013.01)
(52) U.S. Cl.
USPC .......................... 704/500; 704/226; 704/233
(58) Field of Classification Search
USPC .................. 704/226, 233, 500; 375/240.11
See application file for complete search history.

(56) References Cited

U.S. PATENT DOCUMENTS

| | | | | |
|---|---|---|---|---|
| 5,956,674 | A * | 9/1999 | Smyth et al. | 704/200.1 |
| 6,141,639 | A * | 10/2000 | Thyssen | 704/219 |
| 7,483,836 | B2 | 1/2009 | Taori et al. | |
| 8,370,133 | B2 | 2/2013 | Taleb et al. | |
| 2008/0243496 | A1 * | 10/2008 | Wang | 704/226 |
| 2011/0264454 | A1 | 10/2011 | Ullberg et al. | |

FOREIGN PATENT DOCUMENTS

| | | |
|---|---|---|
| DE | 10 2007 004 040 A1 | 10/2007 |
| JP | 2004522198 A | 7/2004 |
| JP | 2006293400 A | 10/2006 |
| JP | 2010538317 A | 12/2010 |
| JP | 2010538318 A | 12/2010 |
| WO | 2009/109050 A1 | 9/2009 |

OTHER PUBLICATIONS

Anisse Taleb, Ericsson, Stefan Karapetkov, Polycom-ITU-T Standards G.719: The First ITU-T Standard for High-Quality Conversational Fullband Audio Coding, IEEE Communications Magazine, Oct. 2009, pp. 124-130.

* cited by examiner

*Primary Examiner* — Daniel D Abebe
(74) *Attorney, Agent, or Firm* — Brooks Kushman P.C.

(57) ABSTRACT

The present invention relates to a method and system for audio encoding and decoding and a method for estimating a noise level, and the method for estimating a noise level in the present invention comprises: estimating a power spectrum of an audio signal to be encoded according to a frequency domain coefficient of the audio signal to be encoded; and estimating a noise level of a zero bit encoding subband audio signal according to the power spectrum obtained by calculating, and this noise level for controlling an energy proportion of noise filling to spectral band replication during decoding; wherein a zero bit encoding subband refers to an encoding subband of which allocated bit number is zero. The present invention can well reconstruct the uncoded frequency domain coefficients.

22 Claims, 5 Drawing Sheets

METHOD AND SYSTEM FOR AUDIO ENCODING AND DECODING AND METHOD FOR ESTIMATING NOISE LEVEL

TECHNICAL FIELD

The present invention relates to an audio encoding and decoding technique, and particularly, to a method and system for audio encoding and decoding of spectrum reconstruction on uncoded encoding subband and a method for estimating a noise level.

BACKGROUND OF THE RELATED ART

The audio encoding technique is the core of the multimedia application technique such as the digital audio broadcast, Internet propagation music and audio communication and so on, and these applications will greatly benefit from the improvement of the compression performance of the audio encoder. The perceptual audio encoder acts as one of the lossy transform domain encoders, and is a modern mainstream audio encoder. Generally, because of the limitation of the encoding bit rate, part of the frequency domain coefficients or frequency components can not be encoded during the audio encoding, and in order to better recover the frequency components of the uncoded subbands, current audio encoder and decoder generally use a method for noise filling or spectral band replication to reconstruct the frequency components of the uncoded subband. The G.722.1C adopts the method for noise filling, the HE-AAC-V1 adopts the spectral band replication technique, and the G.719 adopts the method for the combination of noise filling and simple spectral band replication. Adopting the method for noise filling is unable to well recover the spectrum envelop of the uncoded subband and the tone and noise components inside the subband. The method for the spectral band replication of the HE-AAC-V1 is required to analyze the spectrum of the audio signal before encoding, and to estimate the tone and noise of the high frequency component signals, extract parameters, and after down sampling the audio signal, use the AAC encoder to carry out the encoding, which has high calculation complexity, and is required to send more parameter information to the decoding end, and occupies more encoded bits, and at the same time, also increases the encoding delay. However, the replication scheme of the G.719 is too simple to well recover the spectrum envelop of the uncoded subbands and the tone and noise components inside the subband.

SUMMARY OF THE INVENTION

The technical problem to be solved in the present invention is to provide a method and system for audio encoding and decoding and a method for estimating a noise level, which is for well reconstructing the uncoded frequency domain coefficients.

In order to solve the above technical problem, the present invention provides a method for estimating a noise level, and this method comprises:

estimating a power spectrum of an audio signal to be encoded according to a frequency domain coefficient of the audio signal to be encoded; and estimating a noise level of a zero bit encoding subband audio signal according to the power spectrum obtained by calculating, this noise level being used for controlling an energy proportion of noise filling to spectral band replication during decoding; wherein a zero bit encoding subband refers to an encoding subband of which allocated bit number is zero.

Preferably, said noise level of the zero bit encoding subband audio signal refers to a ratio of a noise components power estimated in the zero bit encoding subband to a tone components power estimated in the zero bit encoding subband.

Preferably, the power spectrum of the audio signal to be encoded is estimated according to a MDCT frequency domain coefficient of the audio signal to be encoded, and a power calculation formula of a frequency point k of the ith frame is as follows:

$P_i(k) = \lambda P_{i-1}(k) + (1-\lambda) X_i(k)^2$, wherein when i is equal to 0, $P_{i-1}(k)=0$; the $P_i(k)$ denotes a power value estimated in the kth frequency point of the ith frame; the $X_i(k)$ denotes a MDCT coefficient in the kth frequency point of the ith frame, and the $\lambda$ is a filtering coefficient of an unipolar smoothing filter.

Preferably, frequency domain coefficients of the audio signal to be encoded are divided into one or more noise filling subbands, and a process of calculating the noise level of a certain valid noise filling subband according to the estimated power spectrum of the audio signal to be encoded particularly comprises:

calculating an average value of powers of all the frequency domain coefficients of all or part of zero bit encoding subbands in this valid noise filling subband to obtain an average power P_aveg(j);

calculating an average value of powers of all the frequency domain coefficients of which the powers $P_i(k)$ are greater than the average power P_aveg(j) of all or part of the zero bit encoding subbands in this valid noise filling subband to obtain a tone components average power P_signal_aveg(j) of the zero bit encoding subbands in this valid noise filling subband;

calculating an average value of powers $P_i(k)$ of all the frequency domain coefficients, of which the powers $P_i(k)$ are less than or equal to the average power P_aveg(j), of all or part of the zero bit encoding subbands in this valid noise filling subband to obtain a noise components average power P_noise_aveg(j) of the zero bit encoding subbands in this valid noise filling subband;

calculating a ratio P_noise_rate(j) of the noise components average power P_noise_aveg(j) to the tone components average power P_signal_aveg(j) to obtain the noise level of this valid noise filling subband.

Wherein, the valid noise filling subband refers to the noise filling subband including zero bit encoding subbands.

In order to solve the above technical problem, the present invention also provides a method for audio encoding, and the method comprises:

A. dividing MDCT frequency domain coefficients of an audio signal to be encoded into a plurality of encoding subbands, and carrying out quantization and encoding for amplitude envelop values of each encoding subband to obtain amplitude envelop encoded bits;

B. carrying out bit allocation for each encoding subband, and carrying out quantization and encoding for non-zero bit encoding subbands to obtain MDCT frequency domain coefficient encoded bits;

C. estimating a power spectrum of the audio signal to be encoded according to the MDCT frequency domain coefficients of the audio signal to be encoded, and estimating a noise level of a zero bit encoding subband audio signal, and quantizing and encoding the noise level to obtain noise level encoded bits; wherein this noise level is used for controlling an energy proportion of noise filling to spectral band replication during decoding, and the zero bit encoding subband refers to an encoding subband of which allocated bit number is zero; and D. after multiplexing and packaging amplitude envelop encoded bits of each encoding subband and frequency domain coefficient encoded bits and noise level encoded bits, sending to a decoding end.

Preferably, in the step C, said noise level of the zero bit encoding subband audio signal refers to a ratio of a noise components power estimated in the zero bit encoding subband to a tone components power estimated in the zero bit encoding subband.

Preferably, the power spectrum of the audio signal to be encoded is estimated according to the MDCT frequency domain coefficients of the audio signal to be encoded, and a power estimation algorithm of a frequency point k of the ith frame is as follows:

$P_i(k)=\lambda P_{i-1}(k)+(1-\lambda)X_i(k)^2$, wherein when i is equal to 0, $P_{i-1}(k)=0$; the $P_i(k)$ denotes a power value estimated in the kth frequency point of the ith frame; the $X_i(k)$ denotes a MDCT coefficient in the kth frequency point of the ith frame, and the $\lambda$ is a filtering coefficient of an unipolar smoothing filter.

Preferably, in step B, the frequency domain coefficients of the audio signal to be encoded are divided into one or more noise filling subbands, and after allocating bits to each encoding subband, bits are allocated to valid noise filling subbands; in step C, a process of calculating the noise level of a certain valid noise filling subband according to the estimated power spectrum of the audio signal to be encoded particularly comprises:

calculating an average value of powers of all the frequency domain coefficients of all or part of zero bit encoding subbands in this valid noise filling subband to obtain an average power P_aveg(j);

calculating an average value of powers of all the frequency domain coefficients of which the powers $P_i(k)$ are greater than the average power P_aveg(j) of all or part of the zero bit encoding subbands in this valid noise filling subband to obtain a tone components average power P_signal_aveg(j) of the zero bit encoding subbands in this valid noise filling subband;

calculating an average value of powers $P_i(k)$ of all the frequency domain coefficients, of which the powers $P_i(k)$ are less than or equal to the average power P_aveg(j), of all or part of the zero bit encoding subbands in this valid noise filling subband to obtain a noise components average power P_noise_aveg(j) of the zero bit encoding subbands in this valid noise filling subband;

calculating a ratio P_noise_rate(j) of the noise components average power P_noise_aveg(j) to the tone components average power P_signal_aveg(j) to obtain the noise level of this valid noise filling subband, Wherein, the valid noise filling subband refers to the noise filling subband including zero bit encoding subbands.

Preferably, when dividing into noise filling subbands, uniform division or non-uniform division according to human ear hearing characteristics is applied, and one noise filling subband includes one or more encoding subbands.

Preferably, in step B, bits are allocated to all the valid noise filling subbands or one or more low frequency valid noise filling subbands are skipped, and bits are allocated to subsequent higher frequency valid noise filling subbands; in step C, the noise level of the valid noise filling subbands to which bits are allocated is calculated; and in step D, these allocated bits are used to multiplex and package the noise level encoded bits.

Preferably, each valid noise filling subband is allocated the same number of bits, or allocated different numbers of bits according to hearing characteristics.

In order to solve the above technical problem, the present invention also provides a method for audio decoding, and the method comprises:

A2. carrying out decoding and inverse quantization for each amplitude envelop encoded bit in a bit stream to be decoded to obtain an amplitude envelop of each encoding subband;

B2. carrying out bit allocation for each encoding subband, carrying out decoding and inverse quantization for noise level encoded bits to obtain a noise level of a zero bit encoding subband, and carrying out decoding and inverse quantization for frequency domain coefficient encoded bits to obtain frequency domain coefficients of a non-zero bit encoding subband;

C2. carrying out spectral band replication for zero bit encoding subbands, and according to the amplitude envelop of each zero bit encoding subband, controlling an overall energy filling level of this encoding subband, and according to the noise level of this zero bit encoding subband, controlling an energy proportion of noise filling to spectral band replication, to obtain reconstructed frequency domain coefficients of zero bit encoding subbands; and D2. carrying out an Inverse Modified Discrete Cosine Transform (IMDCT) for frequency domain coefficients of non-zero bit encoding subbands and reconstructed frequency domain coefficients of zero bit encoding subbands to obtain a final audio signal.

Preferably, in step C2, during spectral band replication, a certain tone position of the audio signal is searched in MDCT frequency domain coefficients, and a bandwidth from 0 frequency point to a frequency point of the tone position is taken as a spectral band replication period, and a frequency segment from a frequency point of the 0 frequency point backward shifting copyband_offset frequency points to a frequency point of the frequency point of the tone position backward shifting the copyband_offset frequency points is taken as a source frequency segment, and the spectral band replication is carried out on a zero bit encoding subband, and if the highest frequency inside the zero bit encoding subband is less than a searched tone frequency, and this zero bit encoding subband only adopts noise filling to carry out spectrum reconstruction.

Preferably, in step C2, an absolute value or a square value of the frequency domain coefficients of a first frequency segment is calculated and smoothing filtered; and according to a result of the smoothing filtering, a maximum extreme value position of first frequency segment filtering outputs is searched, and this maximum extreme value position is taken as the tone position.

Preferably, an operation formula of taking the absolute value of frequency domain coefficients of the first frequency segment to carry out the smoothing filtering is as follows:

$X\_amp_i(k)=\mu X\_amp_{i-1}(k)+(1-\mu)|\overline{X}_i(k)|$ or an operation formula of taking the square value of frequency domain coefficients of the first frequency segment to carry out the smoothing filtering is as follows:

$X\_amp_i(k)=\mu X\_amp_{i-1}(k-1)+(1-\mu)\overline{X}_i(k)^2$ wherein $\mu$ is a smoothing filtering coefficient, $X\_amp_i(k)$ denotes filtering outputs of the kth frequency point of the ith frame, and $\overline{X}_i(k)$ is a decoded MDCT coefficient of the kth frequency point of the ith frame, and when i=0, $X\_amp_{i-1}(k)=0$.

Preferably, said first frequency segment is a frequency segment of low frequencies of which energy is more centralized determined according to spectrum statistic characteristic, wherein low frequencies refer to spectrum components less than half of whole signal bandwidth.

Preferably, the following way is adopted to determine the maximum extreme value of filtering outputs: directly searching an initial maximum value from filtering outputs of frequency domain coefficients corresponding to the first frequency segment, and this maximum value is taken as the maximum extreme value of the first frequency segment filtering outputs.

Preferably, the following way is adopted to determine the maximum extreme value of filtering outputs:

taking a segment in the first frequency segment as a second frequency segment, and searching an initial maximum value from the filtering outputs of the frequency domain coefficients corresponding to the second frequency segment, and according to a position of the frequency domain coefficient corresponding to this initial maximum value, carrying out different processes:

a. if this initial maximum value is the filtering output of the frequency domain coefficient of a lowest frequency of second frequency segment, comparing this filtering output of the frequency domain coefficient of the lowest frequency of second frequency segment with the filtering output of the frequency domain coefficient of a former lower frequency in the first frequency segment, and comparing forwards in sequence, until the filtering output of the current frequency domain coefficient is greater than the filtering output of the former frequency domain coefficient, and the filtering output of the current frequency domain coefficient being a finally determined maximum extreme value, or, comparing until the filtering output of the frequency domain coefficient of a lowest frequency of first frequency segment is greater than the filtering output of a latter frequency domain coefficient, and the filtering output of the frequency domain coefficient of the lowest frequency of first frequency segment being the finally determined maximum extreme value;

b. if this initial maximum value is the filtering output of the frequency domain coefficient of a highest frequency of second frequency segment, comparing this filtering output of the frequency domain coefficient of the highest frequency of second frequency segment with the filtering output of the frequency domain coefficient of a latter higher frequency in the first frequency segment, and comparing backwards in sequence, until the filtering output of the current frequency domain coefficient is greater than the filtering output of the latter frequency domain coefficient, and the filtering output of the current frequency domain coefficient being the finally determined maximum extreme value, or, comparing until the filtering output of the frequency domain coefficient of the highest frequency of first frequency segment is greater than the filtering output of a former frequency domain coefficient, and the filtering output of the frequency domain coefficient of the highest frequency of first frequency segment being the finally determined maximum extreme value;

c. if this initial maximum value is the filtering output of the frequency domain coefficient between the lowest frequency and the highest frequency in the second frequency segment, the frequency domain coefficient corresponding to this initial maximum value being the tone position, namely, this initial maximum value being the finally determined maximum extreme value.

Preferably, in step C2, when the spectral band replication is carried out for a zero bit encoding subband, a source frequency segment replication starting sequence number of this zero bit encoding subband is calculated according to the source frequency segment and a starting sequence number of the zero bit encoding subband which requires carrying out spectral band replication, and then the spectral band replication period is taken as a period, and starting from the source frequency segment replication starting sequence number, frequency domain coefficients of the source frequency segment are periodically replicated to the zero bit encoding subband.

Preferably, in step C2, a way of calculating the source frequency segment replication starting sequence number of this zero bit encoding subband is:

obtaining a sequence number of a frequency point of a start MDCT frequency domain coefficient of the zero bit encoding subband which requires reconstructing frequency domain coefficients, which is denoted as a fillband_start_freq, a sequence number of a frequency point corresponding to the tone is denoted as a Tonal_pos, and the Tonal_pos plus 1 obtains a replication period copy_period, and a spectral band replication offset is denoted as a copyband_offset, and the value of the fillband_start_freq subtracts the copy_period circularly, until this value is in a value range of source frequency segment sequence number, and this value is the source frequency segment replication starting sequence number, which is denoted as copy_pos_mod.

Preferably, in step C2, a way of taking the spectral band replication period as the period, starting from the source frequency segment replication starting sequence number, periodically replicating frequency domain coefficients of the source frequency segment to the zero bit encoding subband is:

replicating frequency domain coefficients starting from source frequency segment replication starting sequence number backwards in sequence to the zero bit encoding subband starting from the fillband_start_freq, until the frequency point of the source frequency segment replication arriving at a Tonal_pos+copyband_offset frequency point, continually replicating frequency domain coefficients starting from the copyband_offset th frequency point backwards to the zero bit encoding subband, and so forth, until completing the spectral band replication of all frequency domain coefficients of the current zero bit encoding subband.

Preferably, in step C2, frequency domain coefficients obtained after zero bit encoding subband replication are energy adjusted by adopting the following way:

calculating an amplitude envelop of frequency domain coefficients obtained after spectral band replication of the zero bit encoding subband, which is denoted as sbr_rms(r);

a formula of carrying out energy adjustment on frequency domain coefficients obtained after replication being:

$$\overline{X\_sbr}(r)=X\_sbr(r)*sbr\_lev\_scale(r)*\mathrm{rms}(r)/sbr\_\mathrm{rms}(r);$$

wherein the $\overline{X\_sbr}(r)$ denotes the frequency domain coefficient after the energy adjustment of the zero bit encoding subband r, the X_sbr(r) denotes the frequency domain coefficient obtained after the replication of the zero bit encoding subband r, the sbr_rms(r) is the amplitude envelop of the frequency domain coefficients X_sbr(r) obtained after the replication of the zero bit encoding subband r, the rms(r) is the amplitude envelop of the frequency domain coefficients before encoding of the zero bit encoding subband r, which is obtained by inverse quantization of an amplitude envelop quantitative index, and the sbr_lev_scale(r) is an energy control scale factor of the spectral band replication of the zero bit encoding subband r, of which a value is determined by the noise level of noise filling subband where the zero bit encod ing subband r is located, and a particular calculation formula is as follows:

$$sbr\_lev\_scale(r) = \sqrt{(1 - \overline{P\_noise\_rate}(j)) * fill\_energy\_saclefactor}$$

the fill_energy_saclefactor is a filling energy scale factor, which is for adjusting an overall filling energy gain, a value range of which is (0, 1), and the $\overline{P\_noise\_rate}(j)$ is the noise level of a noise filling subband j obtained by decoding and inverse quantization, wherein, the j is the sequence number of noise filling subband where the zero bit encoding subband r is located.

Preferably, in step C2, noise filling is carried out for frequency domain coefficients after energy adjustment according to the following formula:

$$\overline{X}(r) = \overline{X\_sbr}(r) + rms(r)*noise\_lev\_scale(r)*random( );$$

wherein the $\overline{X}(r)$ denotes a reconstructed frequency domain coefficient of a zero bit encoding subband r, the $\overline{X\_sbr}(r)$ denotes a frequency domain coefficient after energy adjustment of the zero bit encoding subband r, the rms(r) is the amplitude envelop of the frequency domain coefficients before encoding of the zero bit encoding subband r, which is obtained by inverse quantization of the amplitude envelop quantitative index, the random( ) is a random phase generator, which generates random phase values and returns +1 or −1, and the noise_lev_scale(r) is a noise level control scale factor of the zero bit encoding subband r, of which a value is determined by the noise level of noise filling subband where the zero bit encoding subband r is located, and a specific calculation formula is as follows:

$$noise\_lev\_scale(r) = \sqrt{\overline{P\_noise\_rate}(j) * fill\_energy\_saclefactor}$$

wherein the fill_energy_saclefactor is a filling energy scale factor, which is for adjusting an overall filling energy gain, of which a value range is (0, 1), and the $\overline{P\_noise\_rate}(j)$ is the noise level of the noise filling subband j obtained by decoding and inverse quantization, wherein j is the sequence number of noise filling subband where zero bit encoding subband r is located.

Preferably, in step B2, after bit allocation is carried out for each encoding subband, encoding subbands are divided into a plurality of noise filling subbands, and the bit allocation is carried out for valid noise filling subbands, and in step C2, spectral band replication is carried out for zero bit encoding subbands in the valid noise filling subbands to which bits are allocated and an energy level of replicated frequency domain coefficients and an energy level of noise filling are controlled, and noise filling is carried out for zero bit encoding subbands in an valid noise filling subband to which bits are not allocated, wherein the valid noise filling subband refers to a noise filling subband including the zero bit encoding subband.

In order to solve the above technical problem, the present invention also provides a system for audio encoding, and this system comprising: a Modified Discrete Cosine Transform (MDCT) unit, an amplitude envelop calculating unit, an amplitude envelop quantizing and encoding unit, a bit allocating unit, a frequency domain coefficient encoding unit and a bit stream multiplexer (MUX), and this system also comprises a noise level estimating unit, wherein:

the MDCT unit is for carrying out Inverse Modified Discrete Cosine Transform on an audio signal to transform and generate frequency domain coefficients;

the amplitude envelop calculating unit, which is connected with said MDCT unit, is for dividing frequency domain coefficients generated by MDCT into a plurality of encoding subbands, and calculating amplitude envelop values of each encoding subband;

the amplitude envelop quantizing and encoding unit, which is connected with said amplitude envelop calculating unit, is for carrying out quantization and encoding on amplitude envelop values of each encoding subband, and generating encoded bits of amplitude envelop of each encoding subband;

the bit allocating unit, which is connected with said amplitude envelop quantizing and encoding unit, is for allocating bits for each encoding subband;

the frequency domain coefficient quantizing and encoding unit, which is connected with the MDCT unit, bit allocating unit, and amplitude envelop quantizing and encoding unit, is for carrying out normalization, quantization and encoding processes on all frequency domain coefficients of each encoding subband, and generating frequency domain coefficient encoded bits;

the noise level estimating unit, which is connected with the MDCT unit and bit allocating unit, is for estimating a power spectrum of the audio signal to be encoded according to the MDCT frequency domain coefficients of the audio signal to be encoded, and estimating a noise level of a zero bit encoding subband audio signal, and quantizing and encoding it to obtain noise level encoded bits; wherein this noise level is used for controlling an energy proportion of noise filling to spectral band replication when decoding;

the bit stream multiplexer (MUX), which is connected with said amplitude envelop quantizing and encoding unit, frequency domain coefficient encoding unit and noise level estimating unit, is for multiplexing encoded bit of each encoding subband and encoded bits of frequency domain coefficients, and sending to a decoding end;

Preferably, said noise level of the zero bit encoding subband audio signal refers to a ratio of a noise components power estimated in the zero bit encoding subband to a tone components power estimated in the zero bit encoding subband.

Preferably, said noise level estimating unit specifically comprises:

a power spectrum estimating module, which is for estimating the power spectrum of the audio signal to be encoded according to the MDCT frequency domain coefficients of the audio signal to be encoded, a noise level calculating module, which is connected with said power spectrum estimating module, is for estimating the noise level of the zero bit encoding subband audio signal according to the power spectrum estimated by said power spectrum estimating module; and a noise level encoding module, which is connected with said noise level calculating module, is for carrying out quantization and encoding on the noise level calculated by said noise level calculating module to obtain noise level encoded bits.

Preferably, said power spectrum estimating module adopts the following formula to estimate a power of a frequency point k of the ith frame, and the formula is as follows:

$P_i(k) = \lambda P_{i-1}(k) + (1+\lambda)X_i(k)^2$, wherein when i is equal to 0, $P_{i-1}(k) = 0$; the $P_i(k)$ denotes a power value estimated in the kth frequency point of the ith frame; the $X_i(k)$ denotes the MDCT coefficient in the kth frequency point of the ith frame, and the λ is a filtering coefficient of an unipolar smoothing filter.

Preferably, the frequency domain coefficients of the audio signal to be encoded are divided into one or more noise filling subbands, and the function of said noise level calculating module specifically comprises: calculating an average value of powers of all the frequency domain coefficients of all or part of zero bit encoding subbands in the valid noise filling subband to obtain an average power P_aveg(j); calculating an average value of powers of all the frequency domain coefficients, of which the powers $P_i(k)$ are greater than the average power P_aveg(j), of all or part of the zero bit encoding subbands in the valid noise filling subband, to obtain a tone components average power P_signal_aveg(j) of the zero bit encoding subbands in the valid noise filling subband; calculating an average value of powers $P_i(k)$ of all the frequency domain coefficients, of which the powers $P_i(k)$ are less than or equal to the average power P_aveg(j), of all or part of the zero bit encoding subbands in the valid noise filling subband, to obtain a noise components average power P_noise_aveg(j) of the zero bit encoding subbands in the valid noise filling subband; and for calculating a ratio of the noise components average power P_noise_aveg(j) to the tone components average power P_signal_aveg(j) to obtain the noise level of the valid noise filling subband;

wherein the valid noise filling subband refers to the noise filling subband including zero bit encoding subbands.

Preferably, said noise level estimating unit also comprises a bit allocating module connected with the noise level calculating module and noise level encoding module, and the bit allocating module is for allocating bits to all valid noise filling subbands or skipping one or more low frequency valid noise filling subbands and allocating bits to subsequent higher frequency valid noise filling subbands, and notifying the noise level calculating module and noise level encoding module; the noise level calculating module only calculates the noise level for noise filling subbands to which bits are allocated; and said noise level encoding module uses the bits allocated by said bit allocating module to carry out quantization and encoding on said noise level.

In order to solve the above technical problem, the present invention also provides a system for audio decoding, and the system comprising: a bit stream demultiplexer (DeMUX), an encoding subband amplitude envelop decoding unit, a bit allocating unit, a frequency domain coefficient decoding unit, a spectrum reconstructing unit, and an Inverse Modified Discrete Cosine Transform (IMDCT) unit, wherein said DeMUX is for separating amplitude envelop encoded bits, frequency domain coefficient encoded bits and noise level encoded bits from a bit stream to be decoded;

said amplitude envelop decoding unit, which is connected with the DeMUX, is for carrying out decoding on amplitude envelop encoded bits outputted by said bit stream demultiplexer to obtain an amplitude envelop quantitative index of each encoding subband;

said bit allocating unit, which is connected with said amplitude envelope decoding unit, is for carrying out bit allocation to obtain the number of encoded bits allocated to each frequency domain coefficient of each encoding subband;

the frequency domain coefficient decoding unit, which is connected with the amplitude envelop decoding unit and the bit allocating unit, is for carrying out decoding, inverse quantization and inverse normalization on the encoding subband to obtain frequency domain coefficients;

the noise level decoding unit, which is connected with said bit stream demultiplexer and bit allocating unit, is for carrying out decoding and inverse quantization for the noise level encoded bits to obtain a noise level;

said spectrum reconstructing unit, which is connected with said noise level decoding unit, frequency domain coefficient decoding unit, amplitude envelop decoding unit and bit allocating unit, is for carrying out spectral band replication on zero bit encoding subbands, controlling an overall energy filling level of the encoding subband according to the amplitude envelop outputted by the amplitude envelop decoding unit, and controlling an energy proportion of noise filling to spectral band replication according to the noise level outputted by the noise level decoding unit, and obtaining reconstructed frequency domain coefficients of zero bit encoding subbands;

the IMDCT unit, which is connected with said spectrum reconstructing unit, is for carrying out the IMDCT on frequency domain coefficients after spectrum reconstruction of zero bit encoding subbands, and obtaining an audio signal.

Preferably, said spectrum reconstructing unit comprises: a spectral band replicating sub unit, an energy adjusting sub unit and a noise filling sub unit connected in sequence, wherein the spectral band replicating sub unit is for carrying out spectral band replication on zero bit encoding subbands;

the energy adjusting sub unit is for calculating an amplitude envelop of frequency domain coefficients obtained after spectral band replication of the zero bit encoding subband, which is denoted as sbr_rms(r); and carrying out energy adjustment on frequency domain coefficients obtained after replication according to the noise level outputted by the noise level decoding unit, and the formula of energy adjustment is:

$$\overline{X\_sbr}(r)=X\_sbr(r)*sbr\_lev\_scale(r)*rms(r)/sbr\_rms(r);$$

wherein the $\overline{X\_sbr}(r)$ denotes the frequency domain coefficient after the energy adjustment of the zero bit encoding subband r, the X_sbr(r) denotes the frequency domain coefficient obtained after the replication of the zero bit encoding subband r, the sbr_rms(r) is the amplitude envelop of the frequency domain coefficient X_sbr(r) obtained after the replication of the zero bit encoding subband r, the rms(r) is the amplitude envelop of the frequency domain coefficient before encoding of the zero bit encoding subband r, which is obtained by inversely quantizing an amplitude envelop quantitative index, and the sbr_lev_scale(r) is an energy control scale factor of the spectral band replication of the zero bit encoding subband r, of which a value is determined by the noise level of the noise filling subband where zero bit encoding subband r is located, and aspecific calculation formula is as follows:

$$sbr\_lev\_scale(r) = \sqrt{(1 - \overline{P\_noise\_rate}(j)) * \text{fill\_energy\_saclefactor}}$$

the fill_energy_saclefactor is a filling energy scale factor, which is for adjusting the overall filling energy gain, a value range of which is (0, 1), and the $\overline{P\_noise\_rate}(j)$ is the noise level of the noise filling subband j obtained by decoding and inverse quantization, wherein the j is the sequence number of the noise filling subband where zero bit encoding subband r is located;

the noise filling sub unit is for carrying out noise filling on frequency domain coefficients after energy adjustment according to the noise level outputted by the noise level decoding unit, and the noise filling formula is:

$$\overline{X}(r)=\overline{X\_sbr}(r)+rms(r)*noise\_lev\_scale(r)*random(\ );$$

wherein the $\overline{X}(r)$ denotes a reconstructed frequency domain coefficient of a zero bit encoding subband r, the $\overline{X\_sbr}(r)$ denotes a replicated frequency domain coefficient after the energy adjusting of the zero bit encoding subband r, the rms(r) is the amplitude envelop of the frequency domain coefficient before encoding of the zero bit encoding subband r, which is obtained by inversely quantizing the amplitude envelop quantitative index, the random( ) is a random phase generator, which generates random phase values and returns +1 or −1, and the noise_lev_scale(r) is the noise level control scale factor of the zero bit encoding subband r, of which a value is determined by the noise level of the noise filling subband where zero bit encoding subband r is located, and a specific calculation formula is as follows:

$$\text{noise\_lev\_scale}(r) = \sqrt{\overline{P\_noise\_rate}(j) * \text{fill\_energy\_saclefactor}}$$

wherein the fill_energy_saclefactor is a filling energy scale factor, which is for adjusting an overall filling energy gain, and a value range is (0, 1), and the $\overline{P\_noise\_rate}(j)$ is the noise level of the noise filling subband j obtained by decoding and inverse quantization, wherein j is the sequence number of noise filling subband where zero bit encoding subband r is located.

Preferably, said spectral band replicating sub unit comprises a tone position searching module, a period and source frequency segment calculating module, a source frequency segment replication starting sequence number calculating module and a spectral band replicating module connected in sequence, wherein the tone position searching module is for searching the position of a certain tone of the audio signal in MDCT frequency domain coefficients;

the period and source frequency segment calculating module is for determining a spectral band replication period and source frequency segment for the replication according to the tone position, and this spectral band replication period is a bandwidth from 0 frequency point to a frequency point of the tone position, and said source frequency segment is a frequency segment from a frequency point of the 0 frequency point shifting spectral band replication offset copyband_offset frequency points backwards to a frequency point of the frequency point of the tone position shifting the copyband_offset frequency points backwards;

the source frequency segment replication starting sequence number calculating module is for calculating the source frequency segment replication starting sequence number of the zero bit encoding subband according to the source frequency segment and a starting sequence number of the zero bit encoding subband which requires carrying out the spectral band replication;

the spectral band replicating module is for taking the spectral band replication period as a period, starting from the source frequency segment replication starting sequence number, periodically replicating frequency domain coefficients of the source frequency segment to the zero bit encoding subband; and if the highest frequency inside the zero bit encoding subband is less than a searched-out tone frequency, this frequency point only adopts noise filling to carry out spectrum reconstruction.

Preferably, said tone position searching module adopts the following way to search for the tone position: taking an absolute value or a square value of the MDCT frequency domain coefficients of a first frequency segment, and carrying out smoothing filtering; and according to a result of smoothing filtering, searching for the position of a maximum extreme value of the first frequency segment filtering outputs, and the position of this maximum extreme value being the tone position.

Preferably, an operation formula of said tone position searching module taking an absolute value of MDCT frequency domain coefficients of the first frequency segment to carry out the smoothing filtering is:

$$X\_amp_i(k) = \mu X\_amp_{i-1}(k) + (1-\mu)|\overline{X}_i(k)|$$

or an operation formula of carry out the smoothing filtering on a square value of frequency domain coefficients of the first frequency segment is:

$$X\_amp_i(k) = \mu X\_amp_{i-1}(k-1) + (1-\mu)\overline{X}_i(k)^2$$

wherein $\mu$ is a smoothing filtering coefficient, $X\_amp_i(k)$ denotes filtering outputs of the kth frequency point of the ith frame, and $\overline{X}_i(k)$ are MDCT coefficients after decoding of the kth frequency point of the ith frame, and when i=0, $X\_amp_{i-1}(k)=0$.

Preferably said first frequency segment is a frequency segment of low frequencies of which energy is more centralized determined according to spectrum statistic characteristic, wherein low frequencies refer to spectrum components less than half of total bandwidth of a signal.

Preferably, said tone position searching module calculating module directly searches for an initial maximum value from filtering outputs of frequency domain coefficients corresponding to the first frequency segment, and this maximum value is taken as the maximum extreme value of the first frequency segment filtering outputs.

Preferably, when said tone position searching module determines the maximum extreme value of filtering outputs, a segment in the first frequency segment is taken as a second frequency segment, and an initial maximum value is searched from the filtering outputs of the frequency domain coefficients corresponding to the second frequency segment, and according to the position of the frequency domain coefficient corresponding to this initial maximum value, different processes are carried out:

a. if this initial maximum value is the filtering output of the frequency domain coefficient of a lowest frequency of a second frequency segment, comparing this filtering output of the frequency domain coefficient of the lowest frequency of the second frequency segment with the filtering output of the frequency domain coefficient of a former lower frequency in the first frequency segment, and comparing forwards in sequence, until the filtering output of the current frequency domain coefficient is greater than the filtering output of the former frequency domain coefficient, and the filtering output of the current frequency domain coefficient being a finally determined maximum extreme value, or, comparing until the filtering output of the frequency domain coefficient of a lowest frequency of the first frequency segment is greater than the filtering output of a latter frequency domain coefficient, and the filtering output of the frequency domain coefficient of the lowest frequency of the first frequency segment being the finally determined maximum extreme value;

b. if this initial maximum value is the filtering output of the frequency domain coefficient of a highest frequency of the second frequency segment, comparing this filtering output of the frequency domain coefficient of the highest frequency of the second frequency segment with the filtering output of the frequency domain coefficient of a latter higher frequency in the first frequency segment, and comparing backwards in sequence, until the filtering output of the current frequency domain coefficient is greater than the filtering output of the latter frequency domain coefficient, and the filtering output of the current frequency domain coefficient being the finally determined maximum extreme value, or, comparing until the filtering output of the frequency domain coefficient of a highest frequency of the first frequency segment is greater than the filtering output of a former frequency domain coefficient, and the filtering output of the frequency domain coefficient of the highest frequency of the first frequency segment being the finally determined maximum extreme value;

c. if this initial maximum value is the filtering output of the frequency domain coefficient between the lowest frequency and the highest frequency in the second frequency segment, the frequency domain coefficient corresponding to this initial maximum value being the tone position, namely, this initial maximum value being the finally determined maximum extreme value.

Preferably, a process of said source frequency segment replication starting sequence number calculating module calculating the source frequency segment replication starting sequence number of the zero bit encoding subband which requires carrying out the spectral band replication comprises: obtaining an sequence number of a start frequency point of the zero bit encoding subband which requires reconstructing frequency domain coefficients, which is denoted as a fill band_start_freq, and an sequence number of a frequency point corresponding to the tone being denoted as a Tonal_pos, the Tonal_pos plus 1 obtaining a replication period copy_period, and source frequency segment starting sequence number being denoted as the copyband_offset, the value of the fillband_start_freq subtracting the copy_period circularly, until this value is in a value range of the sequence number of source frequency segment, and this value being the source frequency segment replication starting sequence number, which is denoted as copy_pos_mod.

Preferably, when the spectral band replicating module carries out the spectral band replication, frequency domain coefficients starting from the source frequency segment replication starting sequence number are replicated to the zero bit encoding subband starting from the fillband_start_freq backwards in sequence, until the frequency point of a source frequency segment replication arriving at a Tonal_pos+copyband_offset frequency point, and frequency domain coefficients starting from the copyband_offset th frequency point are continually replicated to the zero bit encoding subband backwards, and so forth, until completing the replication of all frequency domain coefficients of the current zero bit encoding subband.

Preferably, said bit allocating unit is also for allocating bits to all valid noise filling subbands or skipping one or more low frequency valid noise filling subbands, and allocating bits to subsequent higher frequency valid noise filling subbands; said energy adjusting sub unit carries out energy adjustment on frequency domain coefficients obtained after spectral band replication; and said noise filling sub unit carries out noise filling on frequency domain coefficients after energy adjustment and the zero bit encoding subband of the noise filling subband to which bits are not allocated.

The present invention estimates the power spectrum of the audio signal to be encoded by the MDCT frequency domain coefficients in the encoding end, and according to the estimated power spectrum, estimates the noise level of the zero bit encoding subband audio signal, and after encoding the noise level information, sends the encoded noise level information to the decoding end, which is for controlling the energy proportion of the noise filling to spectral band replication of the decoding end; after decoding and obtaining the encoded MDCT frequency domain coefficients in the decoding end, the method of spectral band replication and noise filling is adopted to carry out the frequency domain coefficients reconstruction on the uncoded encoding subband, wherein the energy proportion of the noise filling to spectral band replication is controlled by the noise level encoded bits sent by the encoding end. This method can well recover the spectrum envelop of the uncoded encoding subband and the internal tone and noise components, and obtain a better subjective listening effect.

PREFERRED EMBODIMENTS OF THE PRESENT INVENTION

Figure 1:
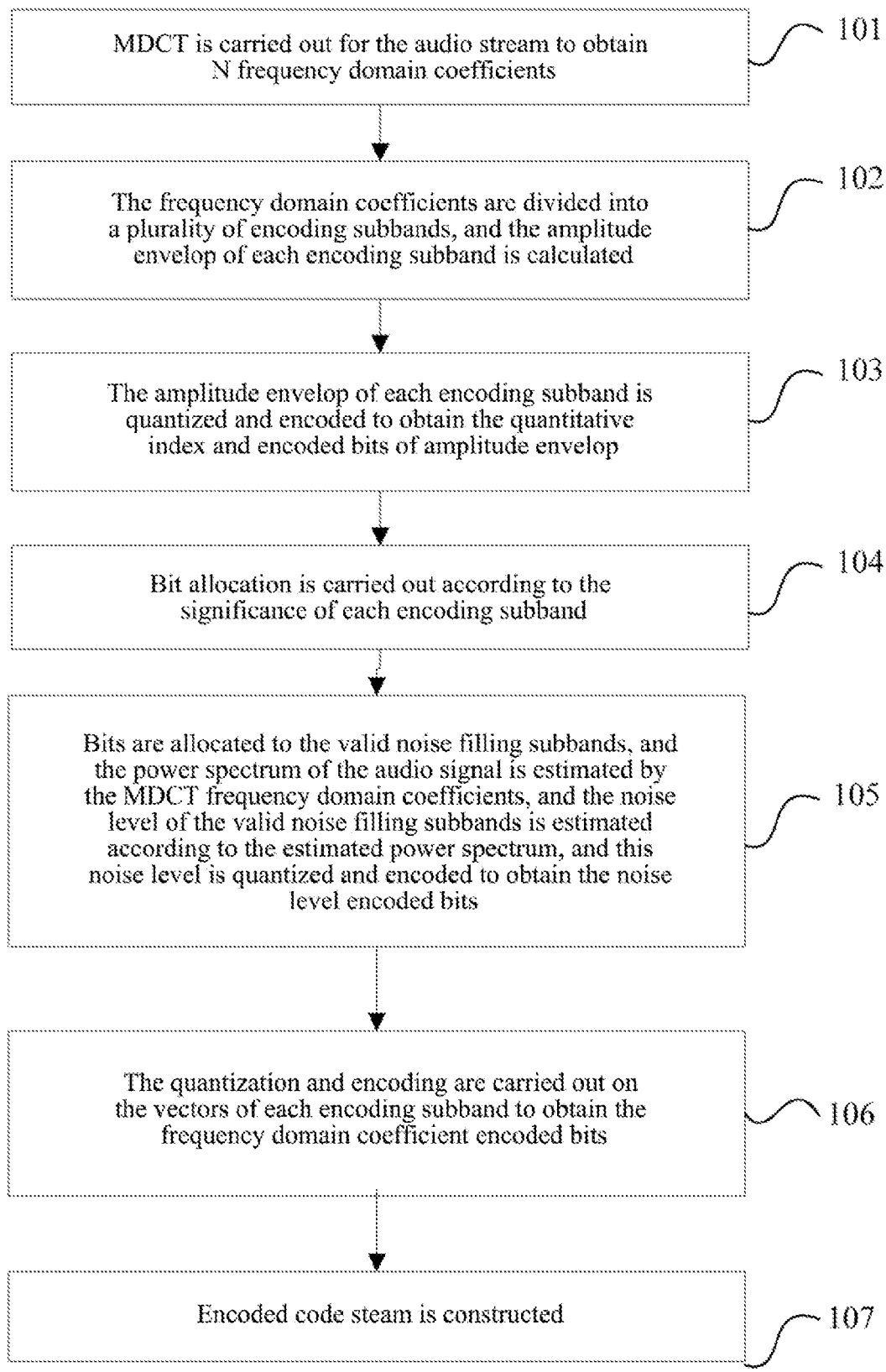
FIG. 1 is a schematic diagram of the method for audio encoding according to the present invention.

The core idea of the present invention is that the encoding end estimates the power spectrum of the audio signal to be encoded by the MDCT frequency domain coefficients, and estimates the noise level of the zero bit encoding subband audio signal by the estimated power spectrum, and after encoding noise level information, sends encoded noise level information to the decoding end for controlling the energy proportion of the noise filling to spectral band replication of the decoding end; after decoding and obtaining the MDCT frequency domain coefficients, the decoding end adopts the method of the spectral band replication and noise filling to carry out the frequency domain coefficients reconstruction on the uncoded encoding subbands, wherein the energy proportion of the noise filling to the spectral band replication is controlled by the noise level encoded bits sent by the encoding end. This method can well recover the spectrum envelop of the uncoded encoding subband and the internal tone and noise components, and obtain a better subjective listening effect.

All frequency domain coefficients said in the present invention refer to the MDCT frequency domain coefficients.

Below it will describe the present invention by four parts of the encoding method, decoding method, encoding system and decoding system in detail:

1. The Encoding Method

The method for audio encoding according to the present invention comprises following steps:

A. the MDCT frequency domain coefficients of the audio signal to be encoded are divided into a plurality of encoding subbands, and the amplitude envelop values of each encoding subband are quantized and encoded to obtain the amplitude envelop encoded bits;

during dividing into encoding subbands, said MDCT transformed frequency domain coefficients are divided into a plurality of encoding subbands with uniform intervals, or divided into a plurality of non-uniformly encoding subbands according to the auditory perception characteristics.

B. the bit allocation is carried out for each encoding subband, and the quantization and encoding are carried out for non-zero bit encoding subbands to obtain encoded bits of the MDCT frequency domain coefficients;

after carrying out the bit allocation on each encoding subband, if the bit number allocated to a certain encoding subband is zero, quantization and encoding are not carried out for this encoding subband, and this application calls this encoding subband as the zero bit encoding subband or uncoded encoding subband, and other encoding subbands are called as the non-zero bit encoding subband.

Which method is adopted to carry out the normalization, quantization, and encoding on each encoding subband is not a concerned focus point of the present invention.

C. according to the MDCT frequency domain coefficients of the audio signal to be encoded, the power spectrum of the audio signal to be encoded is estimated, and further the noise level of the zero bit encoding subband audio signal is estimated, and the noise level encoded bits is obtained by the quantization and encoding; wherein the noise level encoded bits are used for controlling the energy proportion of the noise filling to spectral band replication during the decoding;

said noise level of the zero bit encoding subband audio signal refers to the ratio of the noise components power obtained by estimating in the zero bit encoding subbands to the tone components power obtained by estimating in the zero bit encoding subbands.

D. said amplitude envelop encoded bits, said frequency domain coefficients encoded bits and the noise level encoded bits of each encoding subband are multiplexed and packaged, and sent to the decoding end.

Below it will describe the method for audio encoding in detail according to the present invention with reference to the figures.

Example 1

The Encoding Method

FIG. 1 is a structure schematic diagram of the method for audio encoding according to the example of the present invention. The example takes the audio stream of 20 ms frame length and 32 kHz sampling rate as an example to illustrate the method for audio encoding according to the present invention. In the cases of other frame lengths and sampling rates, the method of the present invention is also applicable. As shown in FIG. 1, this method comprises:

101: the Modified Discrete Cosine Transform (MDCT) is carried out for the audio stream to be encoded to obtain the frequency domain coefficients on N frequency domain sampling points;

the specific implementation way of this step could be:

N points time domain sampling signal x(n) of the current frame and the N points time domain sampling signal $x_{old}(n)$ of the previous frame compose 2N points time domain sampling signal $\bar{x}(n)$, and the 2N points time domain sampling signal can be denoted by the following formula:

$$\bar{x}(n) = \begin{cases} x_{old}(n) & n = 0, 1, \ldots \\ x(n-N) & n = N, N+1, \ldots \end{cases} \quad (1)$$

the MDCT transform is carried out for $\bar{x}(n)$ to obtain the following frequency domain coefficients:

$$X(k) = \sum_{n=0}^{2N-1} \bar{x}(n)w(n)\cos\left[\frac{\pi}{N}\left(n + \frac{1}{2} + \frac{N}{2}\right)\left(k + \frac{1}{2}\right)\right] \quad k = 0, \ldots \quad (2)$$

Wherein the w(n) denotes the sine window function, of which the expression is:

$$w(n) = \sin\left[\frac{\pi}{2N}\left(n + \frac{1}{2}\right)\right] \quad n = 0, \ldots \quad (3)$$

When the frame length is 20 ms and the sampling rate is 32 kHz, 640 frequency domain coefficients are obtained. For other frame lengths and the sampling rates, the corresponding frequency domain coefficients numbers N can also be calculated.

102: the N frequency domain coefficients are divided into a plurality of encoding subbands, and the amplitude envelop of each encoding subband is calculated;

the example adopts the non-uniform subband division to calculate the frequency domain amplitude envelop (simply called as the amplitude envelop) of each subband.

This step can be implemented by the following sub steps:

102a: frequency domain coefficients in the frequency band range which requires processing are divided into L subbands (which can be called encoding subbands);

in this example, the frequency band range which requires processing is 0~13.6 kHz, for which the non-uniform subband division can be carried out according to perceptual characteristics of the human ear, and table 1 shows a specific division way.

The table 1 divides the frequency domain coefficients in the 0~13.6 kHz frequency band range into 28 encoding subbands, namely L=28; and the frequency domain coefficients above the 13.6 kHz are set to 0.

102b: the amplitude envelop of each encoding subband is calculated according to the following formula:

$$Th(j) = \sqrt{\frac{1}{HIndex(j) - LIndex(j) + 1} \sum_{k=LIndex(j)}^{HIndex(j)} X(k)X(k)} \quad (4)$$

$$j = 0, 1, \ldots$$

Wherein the LIndex(j) and HIndex(j) respectively denotes the start frequency point and the end frequency point of the jth encoding subband, of which the specific values are shown in table 1.

TABLE 1 an example of the frequency domain non-uniform subband division way

| The subband sequence number | The start frequency points (LIndex) | The end frequency points (HIndex) | The subband widths (BandWidth) |
|---|---|---|---|
| 0 | 0 | 7 | 8 |
| 1 | 8 | 15 | 8 |
| 2 | 16 | 23 | 8 |
| 3 | 24 | 31 | 8 |
| 4 | 32 | 47 | 16 |
| 5 | 48 | 63 | 16 |
| 6 | 64 | 79 | 16 |
| 7 | 80 | 95 | 16 |
| 8 | 96 | 111 | 16 |
| 9 | 112 | 127 | 16 |
| 10 | 128 | 143 | 16 |
| 11 | 144 | 159 | 16 |
| 12 | 160 | 183 | 24 |
| 13 | 184 | 207 | 24 |
| 14 | 208 | 231 | 24 |
| 15 | 232 | 255 | 24 |
| 16 | 256 | 279 | 24 |
| 17 | 280 | 303 | 24 |
| 18 | 304 | 327 | 24 |
| 19 | 328 | 351 | 24 |
| 20 | 352 | 375 | 24 |
| 21 | 376 | 399 | 24 |
| 22 | 400 | 423 | 24 |
| 23 | 424 | 447 | 24 |
| 24 | 448 | 471 | 24 |
| 25 | 472 | 495 | 24 |
| 26 | 496 | 519 | 24 |
| 27 | 520 | 543 | 24 |

103: the amplitude envelop of each encoding subband is quantized and encoded to obtain the amplitude envelop quantitative index and the amplitude envelop quantitative index encoded bits (namely the amplitude envelop encoded bits);

The following formula (5) is adopted to carry out the quantization on the amplitude envelop of each encoding subband calculated according to formula (4) to obtain the amplitude envelop quantitative index of each encoding subband:

$$Th_q(j) = \lfloor 2 \log_2 Th(j) \rfloor \quad (5)$$

Wherein $\lfloor x \rfloor$ denotes rounding down, $Th_q(0)$ is the amplitude envelop quantitative index of the first encoding subband, and the range is limited to $[-5, 34]$, namely, when $Th_q(0) < -5$, then $Th_q(0) = -5$; and when $Th_q(0) > 34$, then $Th_q(0) = 34$.

The reconstructed quantization amplitude envelop according to the quantitative index is $2^{Th_q(j)/2}$.

The amplitude envelop quantitative index of the first encoding subband is encoded using 6 bits, namely, consuming 6 bits.

The differential operation values among amplitude envelop quantitative indexes of each encoding subband are calculated by adopting the following formula:

$$\Delta Th_q(j) = Th_q(j+1) - Th_q(j) j = 0, \quad (6)$$

The amplitude envelop can be modified in the following to make sure that the range of $\Delta Th_q(j)$ is in $[-15, 16]$:

If $\Delta Th_q(j) < -15$, then setting $\Delta Th_q(j) = -15$, $Th_q(j+1) = Th_q(j) + 15$, $j = L-2, \ldots$;

If $\Delta Th_q(j) > 16$, then setting $\Delta Th_q(j) = 16$, $Th_q(j+1) = Th_q(j) + 16$, $j = 0, \ldots, L-2$;

for $\Delta Th_q(j)$, $j = 0, \ldots, L-2$, the Huffman encoding is carried out, and the consumed bits at this time (which are called Huffman coded bits) are calculated. If the Huffman coded bits at this time are greater than or equal to fixed and allocated bit number (greater than $(L-1) \times 5$ in this example), then the natural encoding way is adopted to encode the $\Delta Th_q(j)$, $j = 0, \ldots, L-2$, and the flag bit of the amplitude envelop Huffman encoding Flag_huff_rms is set to 0; otherwise the $\Delta Th_q(j)$, $j = 0, \ldots, L-2$ is encoded using the Huffman encoding, and the amplitude envelop Huffman encoding flag bit Flag_huff_rms is set to 1. Encoded bits of the amplitude envelop quantitative index (namely encoded bits of the amplitude envelop differential values) and the amplitude envelop Huffman encoded flag bit are sent to the MUX.

104: for each encoding subband, the bit allocation is carried out according to the significance of each encoding subband;

firstly, an initial value of the significance of each encoding subband is calculated according to the code rate distortion theory and encoding subband amplitude envelop information, and then for each subband, the bit allocation is carried out according to the significance of each subband; this step can be implemented by the following sub steps:

104a: the bit consumption average value of single frequency domain coefficient is calculated;

bit number consumed by the side information bit_sides, noise level information reserved bits of the noise filling subband bits_noiseband and bit number consumed by the encoding subband amplitude envelop bits_Th are deducted from the total available bit number of the 20 ms frame length bits_available to obtain the left bit number bits_left which can be used for the frequency domain coefficient encoding, namely:

$$\text{bits\_left} = \text{bits\_available} - \text{bit\_sides} - \text{bits\_Th} - \text{bits\_noiseband} \quad (7)$$

The noise level information reserved bits of the noise filling subband bits_noiseband are bits reserved for the noise level encoded bits of the noise filling subband, and after completing the bit allocation of the noise filling subband, if there are left bits yet, then the left noise level information reserved bits of the noise filling subband bits_noiseband are used for the bit allocation and modification.

The side information includes the bits of the amplitude envelop Huffman encoding flag Flag_huff_rms, frequency domain coefficient Huffman encoding flag Flag_huff_plvq, and the iteration times count. The Flag_huff_rms is used for identifying whether the Huffman encoding is adopted for the subband amplitude envelop; the Flag_huff_plvq is used for identifying whether the Huffman encoding is adopted during carrying out the vector quantization and encoding on the frequency domain coefficients, and the iteration times count is used for identifying the iteration times during the bit allocation and modification (details are shown in the description in subsequent steps).

104b: the significance initial value in the bit allocation of each encoding subband is calculated:

The rk(j) is used to denote the significance for the bit allocation of the jth encoding subband.

104c: for each encoding subband, the bit allocation is carried out according to the significance of each encoding subband;

specific description is as follows:

Firstly, encoding subband where the maximum value is located is found in each rk(j), and the number of this encoding subband is assumed as $j_k$, and then the encoded bit number of each frequency domain coefficient in this encoding subband is increased, and the significance of this encoding subband is decreased; at the same time, the total consumed bit number for this encoding subband bit_band_used($j_k$) is calculated; finally, the summation of the consumed bit number of all encoding subbands sum(bit_band_used(j)), $j = 0, \ldots, L-1$ is calculated; and the above processes are repeated until the summation of the consumed bit number satisfies the maximum value in the restrictive condition of available bits.

The bit allocation number refers to the bit number allocated to a single frequency domain coefficient in one encoding subband. The consumed bit number of one encoding subband refers to the bit number allocated to a single frequency domain coefficient in this encoding subband multiplying the number of the frequency domain coefficients included in this encoding subband.

In this example, for the encoding subbands of which the bit allocation number is 0, step size of the allocation bit is 1 bit, and the significance reduced step size after the bit allocation is 1, and for the encoding subbands of which the bit allocation number is greater than 0 and less than the threshold 5, the bit allocation step size during the addition of bit allocation is 0.5 bit, and the significance reduced step size after the addition of bit allocation is also 0.5, and for the encoding subbands of which the bit allocation number is greater than the threshold 5, the bit allocation step size during addition of bit allocation is 1, and the significance reduced step size after the addition of bit allocation is also 1.

The method for the bit allocation in this step can be denoted by the following pseudo-codes:

Wherein the MaxBit is the maximum encoded bit number allocated to a single frequency domain coefficient in the encoding subband. This example adopts MaxBit=9. This value can be adjusted properly according to the encoding code rate of the encoder and decoder. The region_bit(j) is the bit number allocated to a signal frequency domain coefficient in the jth encoding subband.

105: according to the bit allocation result of the step 104, bits are allocated to the valid noise filling subbands including zero bit encoding subbands inside; the power spectrum of the audio signal is estimated by the MDCT frequency domain coefficients, and the noise level of the valid noise filling subbands is estimated according to the estimated power spectrum; and this noise level information is quantized and encoded to obtain the noise level encoded bits of the noise filling subbands;

N MDCT frequency domain coefficients can be regarded as one noise filling subband, and also can be divided uniformly or can be divided into a plurality of noise filling subbands according to human ear hearing characteristics. One noise filling subband includes one or more encoding subbands.

```
Setting region_bit(j)=0, and j=0,1,...    ;
For the encoding subbands 0, 1,..., L − 1:
{

Searching j_k = argmax[rk(j)];
                   j=0,...

If region_bit(j_k)<5
    {
    If region_bit(j_k)=0
    Setting region_bit(j_k) = region_bit(j_k) + 1;
    Calculating bit_band_used(j_k) = region_bit(j_k) * BandWidth(j_k);
    Setting rk(j_k) = rk(j_k) − 1;
    Or if region_bit(j_k)>=1
    Setting region_bit(jk) = region_bit(jk) + 0.5;
    Calculating bit_band_used(j_k) = region_bit(j_k) * BandWidth(j_k)*0.5;
    Setting rk(j_k) = rk(j_k) − 0.5;
    }
    Or if region_bit(j_k)>=5
    {
    Setting region_bit(j_k) = region_bit(j_k) + 1;

Setting rk(j_k) = { rk(j_k) − 1   if region_bit(j_k) < MaxBit ;
                      { −100          else Calculating bit_band_used(j_k) = region_bit(j_k)×BandWidth(j_k);
    }
    Calculating bit_used_all = sum(bit_band_used(j))   j = 0,1,...,L − 1;
    If bit_used_all < bits_left − 24, returning and searching the j_k in each encoding subband
over again, and circularly calculating the bit allocation value; wherein 24 is the maximum
value
of the encoding subband width.
    Or ending loop, calculating the bit allocation value, and outputting the bit allocation value
at this time.
}
```

Finally, according to the significance of the encoding subband, the left bits less than 24 are allocated to the encoding subbands which satisfy the requirements according to the following principle: preferentially allocating 0.5 bit to each frequency domain coefficient in the encoding subband of which the bit allocation is 1, and at the same time, reducing the significance of this encoding subband 0.5; otherwise allocating 1 bit to each frequency domain coefficient in the subband of which the bit allocation is 0, and at the same time, reducing the significance of this encoding subband 1, until bit_left−bit_used_all<4, and the bit allocation being finished.

The present invention calls the noise filling subband including zero bit encoding subbands inside as the valid noise filling subband.

When bit allocation to the noise filling subband is carried out, bits can be allocated to all the valid noise filling subbands, and also one or more low frequency valid noise filling subbands can be skipped and bits can be allocated to subsequent higher frequency valid noise filling subbands, and correspondingly, during the decoding, the white noise filling way is adopted to carry out the spectrum reconstruction on the zero bit encoding subbands in the low frequency valid noise filling subbands to which bits are not allocated.

Equal bit number is allocated to each valid noise filling subbands, or different bit numbers are allocated according to hearing characteristics of the human ear to each subband. Subsequently, after obtaining the noise level encoded bits of valid noise filling subbands, these bits are multiplexed and packaged.

106: the quantization and encoding are carried out on vectors of the non-zero bit encoding subbands to obtain the frequency domain coefficient encoded bits.

107: encoded code steam is constructed.

Figure 10:
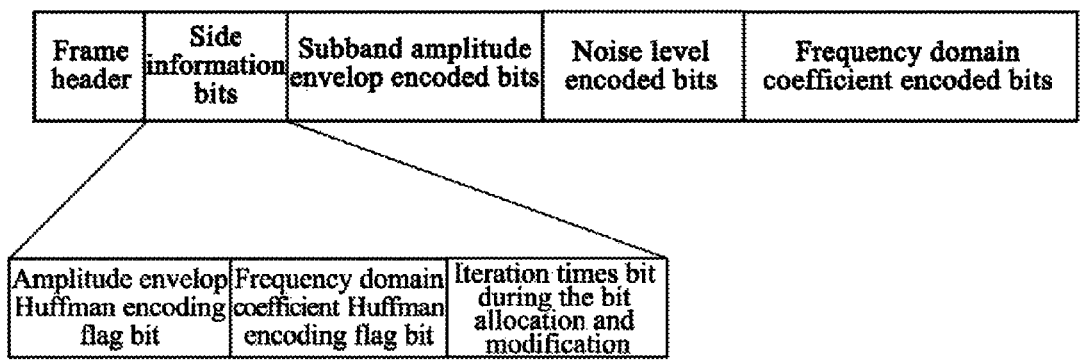
FIG. 10 is a schematic diagram of the code stream composition according to the example of the present invention.

FIG. 10 is a schematic diagram of the code stream composition according to the example of the present invention. Firstly, the side information is written into the bit stream multiplexer MUX according to the following sequence: Flag_huff_rms, Flag_huff_plvq and count; then amplitude envelop encoded bits of the encoding subbands are written into the MUX, then the noise level encoded bits are written into the MUX, and then the frequency domain coefficient encoded bits are written into the MUX; and finally, the code stream written by the above sequence is sent to the decoding end.

Below it will take that the N MDCT frequency domain coefficients are divided into a plurality of noise filling subbands and bits are allocated from the second valid noise filling subband as an example to describe the step 105 in detail with reference to figures.

Figure 2:
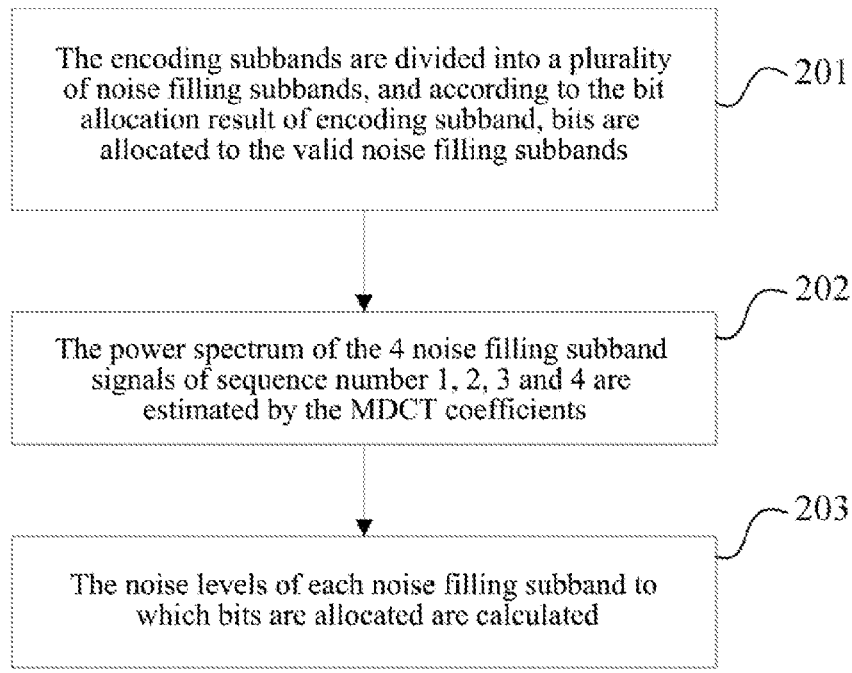
FIG. 2 is a schematic diagram of the flow of obtaining the noise level encoded bits of the zero bit encoding subband inside the noise filling subband according to the present invention.

As shown in FIG. 2, the process of obtaining the noise level encoded bits of the zero bit encoding subbands inside the noise filling subbands specifically comprises:

201: the encoding subbands are divided into a plurality of noise filling subbands, and according to bit allocating result of the encoding subband, bits are allocated to the valid noise filling subbands;

the frequency domain coefficients in frequency range which requires processing are non-uniformly divided into a plurality of subbands according to human ear hearing characteristics, and the subbands are called noise filling subbands; and one noise filling subband includes one or more encoding subbands;

One specific division way in an example is shown in table 2:

encoded bits, and correspondingly, during the decoding, for the noise filling subband of sequence number 0, if there are zero bit encoding subbands inside, then the white noise filling way is adopted to reconstruct spectrum on the frequency domain coefficients of the zero bit encoding subbands, seeing step 504 in detail; starting from the noise filling subband of sequence number 1, it is judged whether there is the zero bit encoding subband inside this noise filling subband, and if this noise filling subband has the zero bit encoding subband, then 2 bits are allocated to this noise filling subband, which is for denoting the noise level information of the zero bit encoding subbands inside this noise filling subband, and noise level information reserved bits of the noise filling subband bits_noiseband subtracts 2. After completing the bit allocation of all the noise filling subbands, the left noise level information reserved bits bits_noiseband are used for bit allocation and modification.

The bit allocation way of noise filling subband in this step can be denoted by the following pseudo-codes:

```
The Nregion_bitflag (j-1) is the bit allocation flag of the noise
   filling subband j, and 1
denotes allocated bits, and 0 denotes not allocated bits.
   Setting the Nregion_bitflag (j-1) = 0, j=1,2,...        e-1 ;
   Setting the left bits of the noise filling subband bit allocation
   noiseband_remain_bits = 0;
   For the noise filling subbands j = 1, 2,......, L_noise-1
   {   Setting region = NLIndex(j),
       NLIndex(j)+1,......NHIndex(j);
       For all of the regions
       {
           If the region_bit(region) is equal to 0
           {
               Then setting Nregion_bit(Nregion) = 1;
                   bits_noiseband = bits_noiseband - 2;
                   Skipping the current loop ;
           }
       }
   }
   noiseband_remain_bits = bits_noiseband ;
```

Each bit allocated to the noise filling subbands being ranked in sequence is the noise level encoded bit said afterwards.

TABLE 2 a non-uniform subband division way example of the noise filling subbands

| The noise filling subband sequence number | The start encoding subband sequence number (NLIndex) | The end encoding subband sequence number (NHIndex) | The number of included encoding subbands (SubBandNum) |
|---|---|---|---|
| 0 | 0 | 11 | 12 |
| 1 | 12 | 13 | 2 |
| 2 | 14 | 16 | 3 |
| 3 | 17 | 20 | 4 |
| 4 | 21 | 28 | 8 |

In the above table 2, the noise filling subbands are ranked according to an order from the low to high of encoding subbands frequencies.

It is assumed that the noise level information reserved bits of the noise filling subbands are reserved two bits in each noise filling subband except the noise filling subband of sequence number 0, and the total reserved bit number is equal to the number of the noise filling subbands minus 1 and then multiplied by 2.

During the bit allocation, bits are not allocated to the noise filling subband of sequence number 0, namely not occupying The above is the process of the bit allocation for the noise filling subbands, and certainly a specified number of bits (for example 2 bits) can be directly reserved to each noise filling subband.

202: based on the noise filling subband division way of the table 2, the power spectrum of the 4 noise filling subband signals of sequence numbers 1, 2, 3 and 4 is estimated by the MDCT coefficients:

The power spectrum estimation algorithm of the frequency point k of the ith frame is as formula (13):

$$P_i(k) = \lambda P_{i-1}(k) + (1-\lambda)X_i(k)^2 \quad (13)$$

Wherein when i is equal to 0, $P_{i-1}(k)=0$; $P_i(k)$ denote the estimated power values of the kth frequency point of the ith frame. $X_i(k)$ denote the MDCT coefficients of the kth frequency point of the ith frame, and $\lambda$ is a filtering coefficient of the unipolar smoothing filter, wherein in one example $\lambda$=0.875;

The principle derivation of the power spectrum estimation by the MDCT is as follows:

The following formula gives the Discrete Time Fourier Transform (DTFT) at the angle frequency $\omega$ of the 2M length signal:

$$X_{DTFT}(\omega) = \sum_{n=0}^{2M-1} x(n)e^{-j\omega n} \tag{14}$$

The DTFT is sampled at 2M frequencies with uniform intervals between 0 and $2\pi$. The sampled transform is called the Discrete Fourier Transform (DFT), and the following formula gives the DFT at the frequency point k:

$$X_{DFT}(k) = X_{DTFT}(2\pi k/2M) = \sum_{k=0}^{2M-1} x(n)e^{-j\frac{2\pi kn}{2M}} \tag{15}$$

The DTFT is sampled using the offset of half frequency point to generate the Shift Discrete Fourier Transform (SDFT):

$$X_{SDFT}(k) = X_{DTFT}(2\pi(k+1/2)/2M) = \sum_{k=0}^{2M-1} x(n)e^{-j\frac{2\pi(k+1/2)n}{2M}} \tag{16}$$

The SDFT which is obtained by adding the window into a practical signal x(n) is as follows:

$$X_{SDFT}(k) = \sum_{k=0}^{2M-1} w(n)x(n)e^{-j\frac{2\pi(k+1/2)n}{2M}} \tag{16}$$

According to the formula (2), the MDCT frequency domain coefficient X(k) is denoted as $X_{MDCT}(k)$, and set M=N, and the formula (2) is rewritten as follows:

$$X_{MDCT}(k) = \sum_{n=0}^{2M-1} \bar{x}(n)w(n)\cos\left(\frac{\pi}{M}\left(n+\frac{1}{2}+\frac{M}{2}\right)\left(k+\frac{1}{2}\right)\right) \tag{17}$$

$k = 0, \ldots$

The SDFT and MDCT are using the same window type, and set $x(n)=\bar{x}(n)$;

The relationship between the MDCT and the SDFT of the practical signal x(n) can be expressed by the following formula:

$$X_{MDCT}(k) = |X_{SDFT}(k)|\cos\left(\angle X_{SDFT}(k) - \frac{\pi}{M}\left(\frac{1}{2}+\frac{M}{2}\right)\left(k+\frac{1}{2}\right)\right) \tag{18}$$

That is the MDCT can be expressed by the amplitude of the cosine modulated SDFT, and this cosine is an angle function of the SDFT.

The power spectrum of the signal is estimated by SDFT of the continuously overlapped window-added blocks of the audio signal, and it is assumed that the transform length of the signal x is 2M, and then the following formula gives the Short Time Shift Discrete Fourier Transform (STSDFT) at the frequency point k and block t:

$$X_{STSDFT}(k,t) = \sum_{k=0}^{2M-1} w(n)x(n+Ht)e^{-j\frac{2\pi(k+1/2)n}{2M}} \tag{19}$$

The H is the jump length of the block. Set the H=M, and the STSDFT and MDCT have the same jump length.

The power spectrum of the signal can be estimated by averaging square amplitudes of the $X_{SDFT}[k,t]$ in many blocks t using the STSDFT, and according to the following formula, the mobile average value of the blocks of length of T is calculated to generate the time variance estimation of the power spectrum:

$$P_{STSDFT}(k,t) = \frac{1}{T}\sum_{\eta=0}^{T-1} |X_{STSDFT}(k, t-\eta)|^2 \tag{20}$$

According to the calculation relationship of the MDCT and SDFT, in certain assumption conditions, $P_{STSDFT}(k,t)$ can be approximately obtained according to $X_{MDCT}(k,t)$. Defining:

$$P_{MDCT}(k,t) = \frac{1}{T}\sum_{\eta=0}^{T-1} |X_{MDCT}(k, t-\eta)|^2 \tag{21}$$

According to the formula (18), it can be obtained that:

$$P_{MDCT}(k,t) = \frac{1}{T}\sum_{\eta=0}^{T-1} |X_{STSDFT}(k, t-\eta)|^2 \cos^2\left(\frac{\angle X_{STSDFT}(k,t-\eta) -}{\frac{\pi}{M}\left(\frac{1}{2}+\frac{M}{2}\right)\left(k+\frac{1}{2}\right)}\right) \tag{22}$$

If it is assumed that the $|X_{STSDFT}(k,t-\eta)|$ and $\angle X_{STSDFT}(k, t-\eta)$ in blocks relatively and independently vary together (this assumption is true for the most of the audio signals), then it can be obtained that:

$$P_{MDCT}(k,t) \cong \tag{23}$$
$$\left(\frac{1}{T}\sum_{\eta=0}^{T-1} |X_{STSDFT}(k,t-\eta)|^2\right)\left(\frac{1}{T}\sum_{\eta=0}^{T-1} \cos^2\left(\frac{\angle X_{STSDFT}(k) -}{\frac{\pi}{M}\left(\frac{1}{2}+\frac{M}{2}\right)\left(k+\frac{1}{2}\right)}\right)\right)$$

If it is further assumed that the $\angle X_{STSDFT}(k)$ is uniformly distributed between 0 and $2\pi$ in T blocks as a whole, and if T is relatively large, then since the expected value of the cosine square of the uniformly distributed phase angle is a half, it can be obtained that:

$$P_{MDCT}(k,t) \cong \frac{1}{2}\left(\frac{1}{T}\sum_{\eta=0}^{T-1}|X_{STSDFT}[k,t-\eta]|^2\right) = \frac{1}{2}P_{STSDFT}(k,t); \tag{24}$$

Therefore, it can be seen that the power spectrum estimated by the MDCT is approximately equal to the half of the power spectrum estimated by the STSDFT.

Because of the requirement of the low encoding operation delay, we choose the unipolar smoothing filter to carry out the power spectrum estimation, and in the $P_{MDCT}(k,t)$, the block t is denoted by i and written as a subscript, and the $P_{MDCT}(k,t)$ can be written as $P_i(k)$, and the length of the block is the length of one frame of audio signal, and then the i denotes the number of the frame, and the final estimation algorithm can be obtained as the formula (13), and the formula (13) is the algorithm for estimating the power spectrum in the present invention.

203: according to the power spectrum estimated by the formula (13), the noise levels of the zero bit encoding subbands in each noise filling subband to which bits are allocated are calculated.

Figure 3:
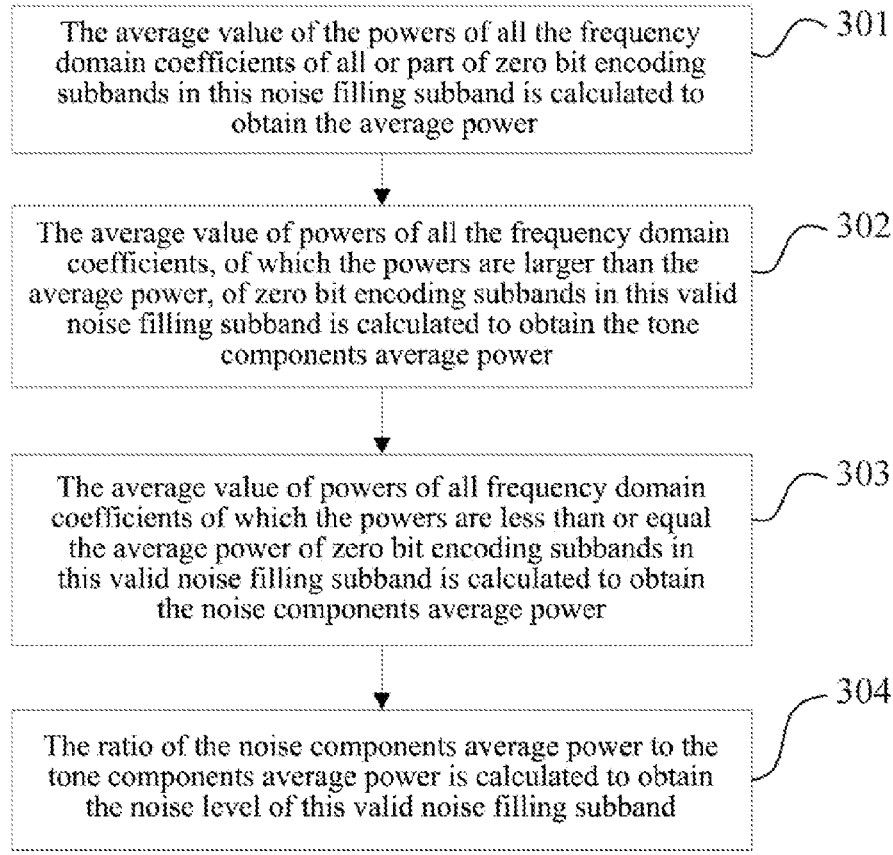
FIG. 3 is a schematic diagram of the flow of calculating the noise level according to the present invention.

As shown in FIG. 3, the specific process of calculating the noise level is:

Step 301: the average value of the powers of all the frequency domain coefficients of all or part of zero bit encoding subbands in this noise filling subband is calculated to obtain the average power P_aveg(j);

Step 302: the frequency domain coefficients of which the powers are greater than the average power of all or part of the zero bit encoding subbands in this noise filling subband are considered as the tone components in this noise filling subband, and the average value of powers of all the frequency domain coefficients of which the powers are greater than the average power P_aveg(j) of all or part of zero bit encoding subbands in this valid noise filling subband is calculated to obtain the tone components average power P_signal_aveg(j) of the zero bit encoding subbands in this valid noise filling subband;

Step 303: the frequency domain coefficients of which the powers are less than or equal to the average power of all or part of the zero bit encoding subbands in this noise filling subband are considered as the noise components in this noise filling subband, and the average value of powers of all frequency domain coefficients of which the powers are less than or equal the average power P_aveg(j) of all or part of zero bit encoding subbands in this valid noise filling subband is calculated to obtain the noise components average power P_noise_aveg(j) of the zero bit encoding subbands in this valid noise filling subband;

Step 304: the ratio P_noise_rate(j) of the noise components average power P_noise_aveg(j) to the tone components average power P_signal_aveg(j) is calculated, of which the value is the noise level of this valid noise filling subband.

The noise level is quantized and encoded to obtain the noise level encoded bits;

The P_noise_rate(j) is quantized and encoded to obtain the P_noise_rate_bits(j). After completing quantization and encoding of the noise level, the noise level encoded bits of the noise filling subband to which bits are allocated are ranked according to the sequence number from low to high of subband to obtain the whole noise level encoded bits of the valid noise filling subband.

An example adopting the non-uniform quantization thereinto is shown in table 3:

TABLE 3 a noise to signal ratio non-uniform quantization example

| P_noise_rate(j) | P_noise_rate_bits(j) |
|---|---|
| [0, 0.04) | 00 |
| [0.04, 0.08) | 01 |
| [0.08, 0.16) | 10 |
| [0.16, 1) | 11 |

The noise level of this valid noise filling subband is the noise level of the zero bit encoding subband in this noise filling subband, and besides denoted by the P_noise_rate(j), the noise level also can be denoted by the ratio of tone components average power P_signal_aveg(j) to the noise components average power P_noise_aveg(j).

2. The Decoding Method

The method for the audio decoding in the present invention is an inverse process of the encoding method, and comprises:

A. each amplitude envelop encoded bit in a bit stream to be decoded is decoded to obtain the amplitude envelop quantitative index of each encoding subband;

B. bits are allocated to each encoding subband, and the noise level encoded bits are decoded and inversely quantized to obtain the noise level of the zero bit encoding subbands, and the frequency domain coefficient encoded bits are decoded and inversely quantized to obtain the frequency domain coefficients of the non-zero bit encoding subbands;

C. the spectral band replication is carried out for the zero bit encoding subbands, and according to the amplitude envelop of each zero bit encoding subband in the bit stream to be decoded, the overall energy filling level of this encoding subband is controlled, and according to the noise level of this zero bit encoding subband, the energy proportion of the noise filling to spectral band replication is controlled, and the reconstructed frequency domain coefficients of the zero bit encoding subbands are obtained;

D. for the frequency domain coefficients of the non-zero bit encoding subbands and the reconstructed frequency domain coefficients of the zero bit encoding subbands, the Inverse Modified Discrete Cosine Transform (IMDCT) is carried out to obtain the final audio signal.

Figure 4:
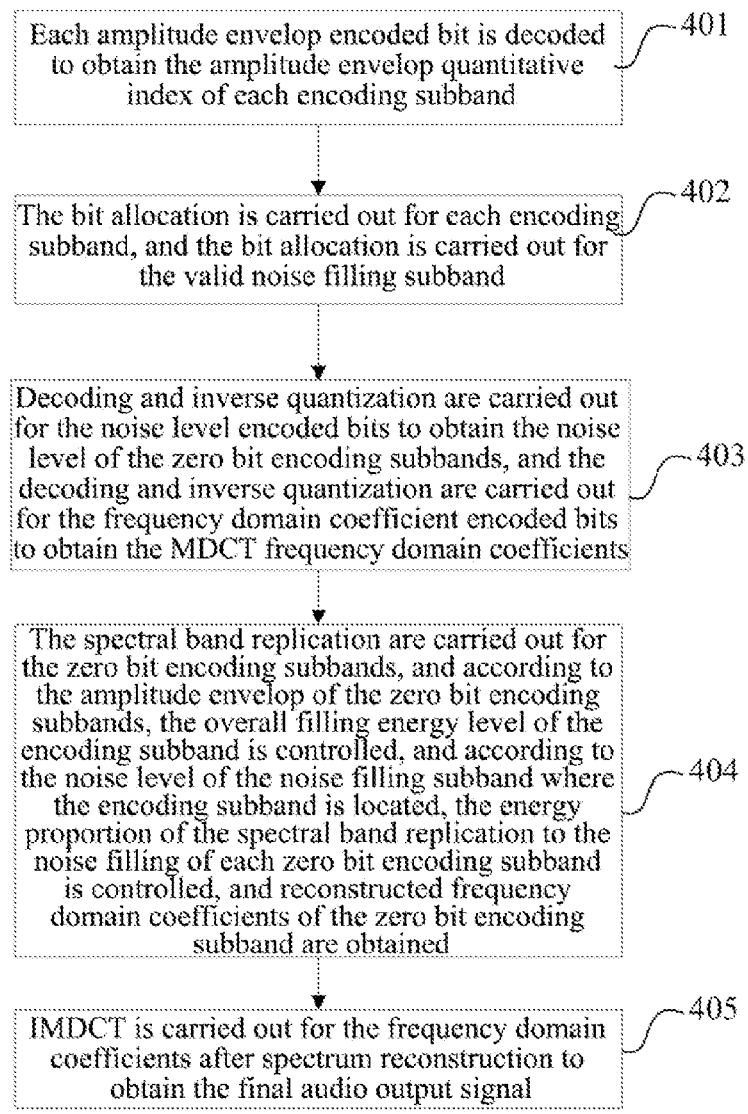
FIG. 4 is a schematic diagram of the method for audio decoding according to the present invention.

FIG. 4 is a structure schematic diagram of the method for audio decoding according to an example of the present invention. As shown in FIG. 4, this method comprises:

401: each amplitude envelop encoded bit is decoded to obtain the amplitude envelop quantitative index of each encoding subband;

One frame of encoded bits is extracted from an encoded bit stream sent from the encoding end (namely from the bit stream demultiplexer DeMUX); after extracting encoded bits, firstly the side information is decoded, and then according to the value of the amplitude envelop Huffman encoding flag Flag_huff_rms, the Huffman decoding or the direct decoding is carried out for each amplitude envelop encoded bit in this frame to obtain the amplitude envelop quantitative index of each encoding subband $Th_q(j)$, j=0, . . . , L−1.

402: for each encoding subband, the bit allocation is carried out, and the bit allocation is carried out for the valid noise filling subband;

according the amplitude envelop quantitative index of each encoding subband, a initial value of significance of each encoding subband is calculated, and the bit allocation is carried out for each encoding subband using the significance of encoding subband to obtain the bit allocation number of the encoding subband; and the bit allocation way in the decoding end is totally same with that in encoding end. In the bit allocation process, the bit allocation step size and significance reduced step size of encoding subband after the bit allocation are varied.

After completing the above bit allocation process, according to the value of the iteration times of bit allocation and modification count in encoding end and the significance of each encoding subband, bit allocation and modification is carried out count times for the encoding subbands, and then the whole process of bit allocation is ended.

In the bit allocation and modification processes, when bits are allocated to the encoding subbands of which the bit allocation number is 0, the bit allocation step size and bit allocation and modification step size are 1 bit, and the significance reduced step sizes after the bit allocation and the bit allocation and modification are 1, and for the encoding subbands of which the bit allocation number is greater than 0 and less than a certain threshold, the bit allocation step size and bit allocation and modification step size during the addition of bit allocation are 0.5 bit, and the significance reduced step sizes after the bit allocation and the bit allocation and modification are also 0.5, and for the encoding subbands of which the bit allocation number is greater than or equal to this threshold, the bit allocation step size and the bit allocation and modification step size during the addition of bit allocation are 1, and the significance reduced step sizes after the bit allocation and the bit allocation and modification are also 1.

The encoding subbands are divided into a plurality of noise filling subbands, and according to the bit allocation result of encoding subband, bits are allocated to the valid noise filling subbands; and division way of the noise filling subbands and the bit allocation way of the noise filling subbands are the same with that in the encoding method, and it will not give unnecessary details any more.

403: decoding and inverse quantization are carried out for the noise level encoded bits to obtain the noise level of the zero bit encoding subbands, and the decoding and inverse quantization are carried out for the frequency domain coefficient encoded bits to obtain the MDCT frequency domain coefficients;

404: the spectral band replication is carried out for the zero bit encoding subbands, according to the amplitude envelop of the zero bit encoding subbands, the overall filling energy level of the encoding subband is controlled, and according to the noise level of the noise filling subband where encoding subband is located, the energy proportion of the spectral band replication to the noise filling of each zero bit encoding subband is controlled, and reconstructed frequency domain coefficients of the zero bit encoding subband are obtained.

The detail process of this step can be seen in the following description of the FIG. 5.

For the zero bit encoding subbands in the valid noise filling subband to which bits are allocated, the spectral band replication is carried out, and the energy level of the frequency domain coefficients which are obtained after the replication and energy level of the noise filling are controlled, and the noise filling is carried out for the zero bit encoding subbands in the valid noise filling subband to which bits are not allocated.

405: for the spectrum reconstructed frequency domain coefficients, the Inverse Modified Discrete Cosine Transform (IMDCT) is carried out to obtain the final audio output signal.

Figure 5:
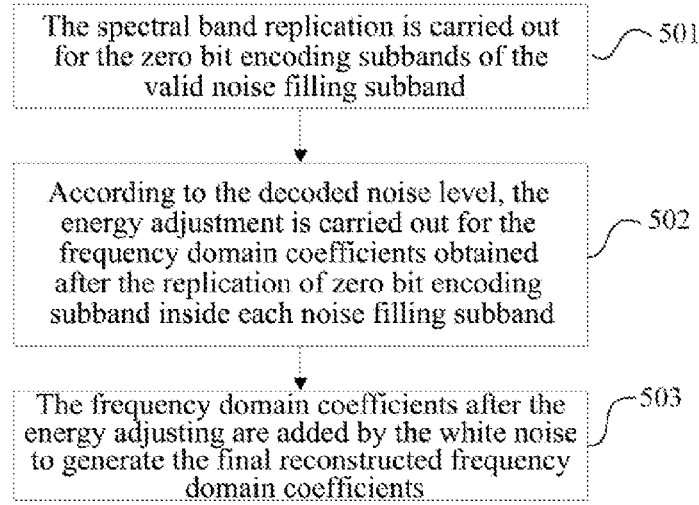
FIG. 5 is a schematic diagram of the flow of the spectrum reconstruction according to the present invention.

Below it will describe the step 404 in detail with reference to FIG. 5:

As shown in FIG. 5, the step 404 specifically comprises:

Step 501: for the zero bit encoding subbands of the valid noise filling subband, the spectral band replication is carried out;

the position of a certain tone of the audio signal is searched in the MDCT frequency domain coefficients, and the bandwidth from the 0 frequency point to the frequency point of the tone position is the spectral band replication period, and the frequency segment from frequency point of the 0 frequency point shifting copyband_offset frequency points backwards to frequency point of the tone position shifting the copyband_offset frequency points backwards is taken as the spectral band replication source frequency segment, and for the zero bit encoding subbands, the spectral band replication is carried out. If the highest frequency inside the zero bit encoding subband which requires the spectral band replication is less than the searched-out tone frequency, this frequency point only adopts the noise filling to carry out the spectrum reconstruction.

The frequency domain coefficients are ranked according to an order from low to high of frequencies, and shifting backwards is shifting towards the high frequency position.

Below it will describe this spectral band replication way in detail:

a. a certain tone position of the audio signal is searched in the MDCT frequency domain coefficients;

the preferable way in the present invention of searching the tone position is to carry out the smoothing filtering on the MDCT frequency domain coefficients: taking the absolute value or square value of the MDCT frequency domain coefficients for a certain specific frequency segment of low frequencies, and carrying out the smoothing filtering; according to the result of the smoothing filtering, searching the position of maximum extreme value of the filtering outputs, and position of this maximum extreme value being taken as the tone position;

The tone of the audio signal said in the present invention refers to the pitch of a audio signal or a certain harmonic of the pitch.

The specific frequency segment said herein could be a determined frequency segment of which the energy is more centralized according to the spectrum characteristics, which is called the first frequency segment. And the low frequency herein refers to the frequency components less than half of the total bandwidth of the signal.

The frequency domain coefficients herein are the MDCT frequency domain coefficients after decoding in step 403, which are ranked from low to high in frequencies.

The operation formula of taking the absolute value of the frequency domain coefficients of this first frequency segment to carry out the smoothing filtering is as follows:

$$X\_amp_i(k)=\mu X\_amp_{i-1}(k)+(1-\mu)|\overline{X}_i(k)|$$

Or, the operation formula of taking the square value of the frequency domain coefficients of this first frequency segment to carry out the smoothing filtering is as follows:

$$X\_amp_i(k)=\mu X\_amp_{i-1}(k-1)+(1-\mu)\overline{X}_i(k)^2$$

Wherein $\mu$ is a smoothing filtering coefficient, of which the value range is (0, 1), and the value could be 0.125. $X\_amp_i(k)$ denotes the filtering outputs of the kth frequency point of the ith frame, and $\overline{X}_i(k)$ is the decoded MDCT coefficients of the kth frequency point of the ith frame, and when i=0, $X\_amp_{i-1}(k)=0$.

Searching for the position of maximum extreme value of the first frequency segment filtering outputs has following two ways:

(1) an initial maximum value is directly searched from the filtering outputs of the frequency domain coefficients corresponding to the first frequency segment, and this maximum value is taken as the maximum extreme value of the first frequency segment filtering outputs, and the sequence number of the corresponding frequency point is taken as position of the maximum extreme value (namely the tone);

(2) during searching for the maximum extreme value, a segment in this first frequency segment is taken as the second frequency segment, and an initial maximum value is searched from the filtering outputs of the frequency domain coefficients corresponding to the second frequency segment, and this initial maximum value is taken as the maximum extreme value of the first frequency segment filtering outputs, and the sequence number of the corresponding frequency point is taken as the position of the maximum extreme value (namely the tone).

The start point position of the second frequency segment is greater than the start point of the first frequency segment, and the end point position of the second frequency segment is less than the end point of the first frequency segment, and preferably, the numbers of frequency coefficients in the first frequency segment and the second frequency segment are not less than 8.

In order to avoid that the frequency domain coefficient corresponding to the searched-out initial maximum value is not the position of tone of the audio signal, during searching for the tone position, firstly the initial maximum value is searched from the filtering outputs of this second frequency segment, and according to the position of the frequency domain coefficient corresponding to the initial maximum value, different processes are carried out:

(a) if this initial maximum value is the filtering output of the frequency domain coefficient of the lowest frequency of second frequency segment, this filtering output of the frequency domain coefficient of the lowest frequency of the second frequency segment is compared with the filtering output of the frequency domain coefficient of the former lower frequency in the first frequency segment, and compared forwards in sequence, until the filtering output of the current frequency domain coefficient is greater than the filtering output of the former frequency domain coefficient, and the current frequency domain coefficient is considered as the tone position, namely this filtering output of the current frequency domain coefficient is the finally determined maximum extreme value, or, until the filtering output of the frequency domain coefficient of the lowest frequency of the first frequency segment is greater than the filtering output of the latter frequency domain coefficient by comparing, and the frequency domain coefficient of the lowest frequency of the first frequency segment is considered as the tone position, namely the filtering output of the frequency domain coefficient of the lowest frequency of the first frequency segment is the finally determined maximum extreme value;

(b) if this initial maximum value is the filtering output of the frequency domain coefficient of the highest frequency of the second frequency segment, this filtering output of the frequency domain coefficient of the highest frequency of the second frequency segment is compared with the filtering output of the frequency domain coefficient of the latter higher frequency in the first frequency segment, and compared backwards in sequence, until the filtering output of the current frequency domain coefficient is greater than the filtering output of the latter frequency domain coefficient, and the current frequency domain coefficient is considered as the tone position, namely this filtering output of the current frequency domain coefficient is the finally determined maximum extreme value, or, until the filtering output of the frequency domain coefficient of the highest frequency of the first frequency segment is greater than the filtering output of the former frequency domain coefficient by comparing, and the frequency domain coefficient of the highest frequency of the first frequency segment is considered as the tone position, namely the filtering output of the frequency domain coefficient of the highest frequency of the first frequency segment is the finally determined maximum extreme value;

(c) if this initial maximum value is the filtering output of the frequency domain coefficient between the lowest frequency and the highest frequency in the second frequency segment, the frequency domain coefficient corresponding to this initial maximum value is the tone position, namely, this initial maximum value is the finally determined maximum extreme value.

Below it will describe the way of determining the audio signal position by taking that frequency domain coefficients of the first frequency segment are 24th to 64th MDCT frequency domain coefficients, and the frequency domain coefficients of the second frequency segment are the 33rd to the 56th MDCT frequency domain coefficients as an example.

The maximum value is searched from the filtering outputs of the 33rd to 56th MDCT frequency domain coefficients; if the maximum value corresponds to the 33rd frequency domain coefficient, it is judged whether the detected output result of the 32nd frequency domain coefficient is greater than that of the 33 frequency domain coefficient, and if yes, comparison is continued forwards, and it is judged whether the detected output result of the 31st frequency domain coefficient is greater than that of the 32nd frequency domain coefficient, comparing in sequence forwards according to this way, until the filtering output of the current frequency domain coefficient is greater than that of the former one; or until finding the filtering output of the 24th frequency domain coefficient is greater than the filtering output of the 25th frequency domain coefficient, and then the current frequency domain coefficient or the 24th frequency domain coefficient is the tone position.

If the maximum value is the 56, a similar way will be adopted to search in sequence backwards, until the filtering output of the current frequency domain coefficient is greater than that of the latter one, and the current frequency domain coefficient is the tone position; or until finding the filtering output of the 64th frequency domain coefficient is greater than the filtering output of the 63rd frequency domain coefficient, and then the 64th frequency domain coefficient is the tone position.

If the maximum value is between the 33 and 56, the coefficient domain coefficient corresponding to this maximum value is the tone position.

This position value is denoted as Tonal_pos, namely the sequence number of the frequency point corresponding to the maximum extreme value.

b. the bandwidth from the 0 frequency point to the frequency point of the tone position is taken as a period, the frequency segment from the 0 frequency point shifting copyband_offset frequency points backwards to the frequency point of the tone position shifting copyband_offset frequency points backwards is taken as the source frequency segment to carry out the spectral band replication on the zero bit encoding subbands.

Namely, the starting sequence number of the frequency point of the source frequency segment is the copyband_offset, and the end sequence number is the copyband_offset+Tonal_pos.

In the present invention, the value of the spectral band replication offset (denoted as the copyband_offset) is preset, and copyband_offset≥0, and when the preset copyband_offset=0, the source frequency segment is the frequency segment from the 0 frequency point to the frequency point of the tone position, and in order to decrease the spectrum jumps of the replicated frequency band, the copyband_offset is set greater than zero, and then the source frequency segment is the MDCT frequency domain coefficient of the frequency segment from the 0 frequency point shifting a small range of (denoted as the copyband_offset) frequency points backwards to frequency point of the maximum extreme value position shifting the same small range of (denoted as the copyband_offset) frequency points backwards, and the spectrum filling of the zero bit encoding subband inside the valid noise filling subband (for example sequence numbers are 1, 2, 3, and 4) above a certain frequency point is replicated from the source frequency segment.

Corresponding to the flow of the FIG. 2, the zero bit encoding subbands of the first noise filling subband adopt the random noise filling way to carry out the spectrum reconstruction, and for the zero bit encoding subbands of the noise filling subband of sequence numbers 1, 2, 3, and 4, the way of the frequency domain coefficient replication combining the noise filling is adopted to carry out the spectrum reconstruction.

During carrying out the spectral band replication, firstly according to the source frequency segment and the starting sequence number of the zero bit encoding subband which requires the spectral band replication, the source frequency segment replication starting sequence number of this zero bit encoding subband is calculated, and then taking the spectral band replication period as the period, starting from the source frequency segment replication starting sequence number, the frequency domain coefficients of the source frequency segment are periodically replicated to the zero bit encoding subband.

A way of determining source frequency segment replication starting sequence number is:

Firstly, starting from the first zero bit encoding subband which requires replicating, the sequence number of the frequency point of the start MDCT frequency domain coefficient of the zero bit encoding subband which requires reconstructing the frequency domain coefficients is obtained, which is denoted as the fillband_start_freq, the sequence number of the frequency point corresponding to the tone is denoted as the Tonal_pos, and replication period of the frequency band is denoted as the copy_period. The copy_period is equal to the Tonal_pos plus 1. If the highest frequency inside the zero bit encoding subband which requires the spectral band replication is less than the searched-out frequency of the tone, then this frequency point only adopts the noise filling to carry out the spectrum reconstruction, without carrying out the spectral band replication. And the spectral band replication offset is denoted as the copyband_offset, and the value of the fillband_start_freq circularly subtracts the copy_period until the value falls into the value range of the sequence number of the source frequency segment, and this value is the source frequency segment replication starting sequence number, which is denoted as the copy_pos_mod.

The source frequency segment replication starting sequence number copy_pos_mod can be obtained by the following pseudo-codes algorithm:

```
Setting the copy_pos_mod = fillband_start_freq;
When copy_pos_mod > (Tonal_pos + copyband_offset)
{
    copy_pos_mod = copy_pos_mod − copy_period;
}
```

After completing the operation, the copy_pos_mod is the source frequency segment replication starting sequence number.

During the replication, the frequency domain coefficients starting from the source frequency segment replication starting sequence number are replicated in sequence backwards to the zero bit encoding subband taking the fillband_start_freq as the start position, until the frequency point of source frequency segment replication arrives at the frequency point of the Tonal_pos+copyband_offset, and the frequency domain coefficients starting from the copyband_offset th frequency point are continually replicated backwards to this zero bit encoding subband over again, and the rest may be deduced by analogy, until completing the spectral band replication of all the frequency domain coefficients in the current zero bit encoding subband.

When the spectral band replication offset copyband_offset is set to 10, the frequency band starting from the copy_pos_mod is replicated to the zero bit encoding subband starting from the fillband_start_freq according to an order from the low frequency to high frequency, until after the Tonal_pos+10 frequency point, replication is starting from the 10th frequency domain coefficient over again, and the rest may be deduced by analogy, and all the signals of this zero bit encoding subband are replicated from the 10 to Tonal_pos+10 frequency domain coefficients, and the frequency domain coefficients from the frequency points 10 to Tonal_pos+10 are the source frequency segment of the spectral band replication.

By adopting the above way, the spectrum is replicated for all the zero bit encoding subbands of the noise filling subbands of sequence numbers 1, 2, 3, and 4.

Besides the above way of spectral band replication, other ways of spectral band replication are also applicable for the present invention, which does not affect the implementation of the present invention.

Step 502: according to the decoded noise level, the energy adjustment is carried out for the frequency domain coefficients obtained after the replication of zero bit encoding subbands inside each the noise filling subband;

The amplitude envelop of the frequency domain coefficients obtained after the zero bit encoding subband replication is calculated, which is denoted as the sbr_rms(r).

The calculation formula of the frequency domain coefficients after the energy adjusting is:

$$\overline{X\_sbr}(r) = X\_sbr(r) * sbr\_lev\_scale(r) * rms(r)/sbr\_rms(r);$$

Wherein the $\overline{X\_sbr}(r)$ denotes the frequency domain coefficients after the energy adjusting of the zero bit encoding subband r, the X_sbr(r) denotes the frequency domain coefficients after the replication of the zero bit encoding subband r, the sbr_rms(r) is the amplitude envelop (namely its root mean square) of the frequency domain coefficients X_sbr(r) obtained after the replication of the zero bit encoding subband r, the rms(r) is the amplitude envelope of the frequency domain coefficients before encoding of the zero bit encoding subband r, which is obtained by inversely quantizing the amplitude envelop quantitative index, and the sbr_lev_scale(r) is the energy control scale factor of the spectral band replication of the zero bit encoding subband r, of which the value is determined by the noise level of noise filling subband where the zero bit encoding subband r is located, and the specific calculation formula is as follows:

$$sbr\_lev\_scale(r) = \sqrt{(1 - \overline{P\_noise\_rate}(j)) * fill\_energy\_scalefactor}$$

The fill_energy_saclefactor is the filling energy scale factor, which is for adjusting the gain of the overall filling energy, and the value range is (0, 1), and the value in this example is 0.2. The $\overline{P\_noise\_rate}(j)$ is the noise level of the noise filling subband j obtained by decoding and inverse quantization, of which the inverse quantization value can be obtained from the quantization range in table 3 according to the noise level encoded bits. An implementation example in this example is shown in table 10:

TABLE 10

| inverse quantization values of noise level | |
|---|---|
| P_noise_rate_bits(j) | $\overline{\text{P\_noise\_rate}}$(j) |
| 00 | 0.04 |
| 01 | 0.08 |
| 10 | 0.15 |
| 11 | 0.30 |

Wherein j is the sequence number of noise filling subband where the zero bit encoding subband r is located.

Step 503: the frequency domain coefficients after the energy adjusting are added by the white noise to generate the final reconstructed frequency domain coefficients.

After completing the energy adjustment of the replication of frequency domain coefficients, the frequency domain coefficients after the energy adjusting are added by the white noise to generate the final reconstructed frequency domain coefficient $\overline{X}$:

$$\overline{X}(r) = \overline{X\_sbr}(r) + \text{rms}(r) * \text{noise\_lev\_scale}(r) * \text{random}(\ );$$

Wherein the $\overline{X}(r)$ denotes the reconstructed frequency domain coefficient of the zero bit encoding subband r, the $\overline{X\_sbr}(r)$ denotes the energy adjusted frequency domain coefficient of the zero bit encoding subband r, the rms(r) is the amplitude envelop of the frequency domain coefficients before encoding of the zero bit encoding subband r, which is obtained by inversely quantizing the amplitude envelop quantitative index, the random( ) is the random phase generator, which generates the random phase value and returns +1 or −1, and the noise_lev_scale(r) is the noise level control scale factor, of which the value is determined by the noise level of noise filling subband where the zero bit encoding subband r is located. And the specific operation formula is as follows:

$$\text{noise\_lev\_scale}(r) = \sqrt{\overline{\text{P\_noise\_rate}}(j) * \text{fill\_energy\_scalefactor}}$$

Wherein the fill_energy_saclefactor is the filling energy scale factor, which is for adjusting gain of the overall filling energy, and the value range is (0, 1), and the value is 0.2 in this example. The $\overline{\text{P\_noise\_rate}}$(j) is the noise level of the noise filling subband j obtained by decoding and inversely quantizing, wherein j is the sequence number of noise filling subband where zero bit encoding subband r is located.

Certainly, for the zero bit encoding subbands in the valid noise filling subband to which bits are not allocated (for example the noise filling subband of the sequence number 0), the white noise filling should be carried out to implement the frequency domain coefficient reconstruction, and herein it will not give unnecessary details any more.

The present invention also provides a method for estimating a noise level, and this method comprises:

estimating a power spectrum of an audio signal to be encoded according to frequency domain coefficients of the audio signal to be encoded;

estimating a noise level of a zero bit encoding subband audio signal according to the estimated power spectrum, and this noise level for controlling an energy proportion of noise filling to spectral band replication during decoding; wherein the zero bit encoding subband refers to the encoding subband of which the allocated bit number is zero. One noise level can be calculated for each zero bit encoding subband, and also one common noise level can be calculated with a plurality of noise subbands.

Preferably, said noise level of the zero bit encoding subband audio signal refers to a ratio of the noise components power estimated in the zero bit encoding subband to the tone components power estimated in the zero bit encoding subband.

Preferably, the power spectrum of the audio signal to be encoded is estimated according to MDCT frequency domain coefficients of the audio signal to be encoded, and the power estimation formula of the frequency point k of the ith frame is as follows:

$P_i(k) = \lambda P_{i-1}(k) + (1-\lambda) X_i(k)^2$, wherein when i is equal to 0, $P_{i-1}(k) = 0$; and $P_i(k)$ denotes the estimated power value of the kth frequency point of the ith frame; and $X_i(k)$ denotes the MDCT coefficients of the kth frequency point of the ith frame, and the $\lambda$ is the filtering coefficient of the unipolar smoothing filter.

Preferably, the frequency domain coefficients of the audio signal to be encoded are divided into one or more noise filling subbands, and the process of calculating the noise level of a certain valid noise filling subband according to the estimated power spectrum of the audio signal to be encoded specifically comprises:

calculating an average value of powers of all the frequency domain coefficients of all or part of zero bit encoding subbands in this valid noise filling subband to obtain an average power P_aveg(j);

calculating an average value of powers of all the frequency domain coefficients of which the powers $P_i(k)$ are greater than the average power P_aveg(j) of all or part of the zero bit encoding subbands in this valid noise filling subband to obtain the tone components average power P_signal_aveg(j) of the zero bit encoding subbands in this valid noise filling subband;

calculating an average value of powers $P_i(k)$ of all the frequency domain coefficients of which the powers $P_i(k)$ are less than or equal to the average power P_aveg(j) of all or part of the zero bit encoding subbands in this valid noise filling subband to obtain the noise components average power P_noise_aveg(j) of the zero bit encoding subbands in this valid noise filling subband; and calculating a ratio P_noise_rate(j) of the noise components average power P_noise_aveg(j) to the tone components average power P_signal_aveg(j) to obtain the noise level of this valid noise filling subband.

Wherein, the valid noise filling subband refers to the noise filling subband including zero bit encoding subbands.

3. The Encoding System

Figure 6:
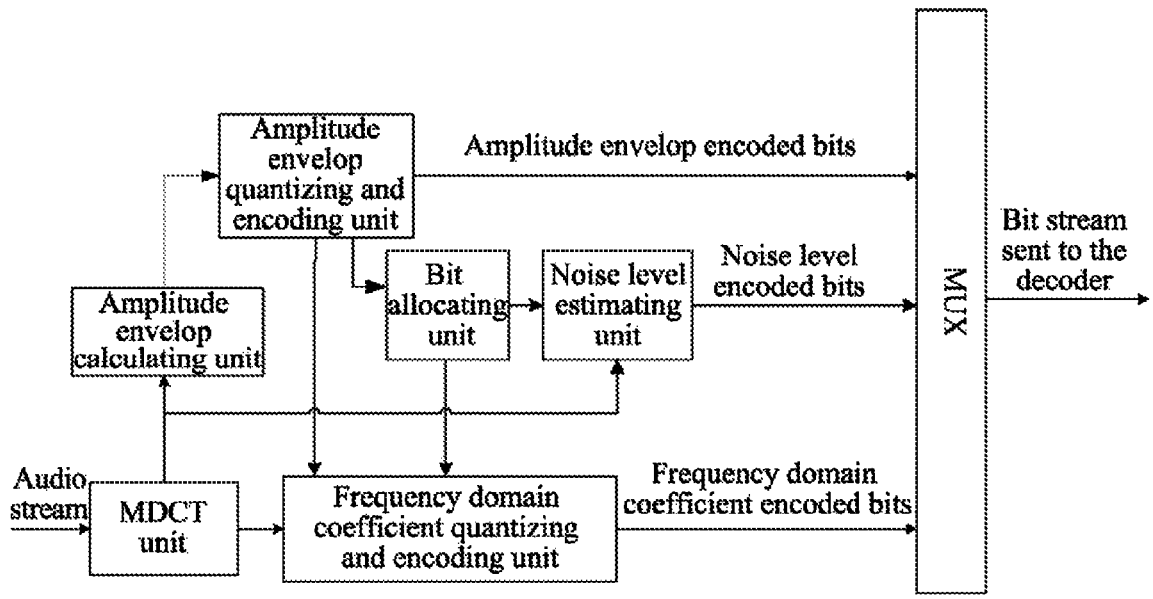
FIG. 6 is a structure schematic diagram of the system for audio encoding according to the present invention.

In order to implement the above encoding method, the present invention also provides a system for audio encoding, and as shown in FIG. 6, this system comprises: a Modified Discrete Cosine Transform (MDCT) unit, an amplitude envelop calculating unit, an amplitude envelop quantizing and encoding unit, a bit allocating unit, a frequency domain coefficient encoding unit, a noise level estimating unit and a bit stream multiplexer (MUX); wherein:

The MDCT unit is for carrying out the inverse modified discrete cosine transform to transform and generate the frequency domain coefficients for the audio signal;

The amplitude envelop calculating unit, which is connected with said MDCT unit, is for dividing said MDCT generated frequency domain coefficients into a plurality of encoding subbands, and calculating the amplitude envelop of each encoding subband;

When the amplitude envelop calculating unit divides the frequency domain coefficients into encoding subbands, said MDCT transformed frequency domain coefficients are divided into a plurality encoding subbands with uniform intervals, or divided into a plurality of non-uniform encoding subbands according to the hearing perceptual characteristics.

The amplitude envelop quantizing and encoding unit, which is connected with said amplitude envelop calculating unit, is for the quantization and encoding of the amplitude envelop value of each encoding subband to generate the amplitude envelop encoded bits of each encoding subband;

The bit allocating unit, which is connected with said amplitude envelop quantizing and encoding unit, is for carrying out the bit allocation to obtain the encoded bit number allocated to each frequency domain coefficient in each encoding subband;

Specifically, the bit allocating unit comprises an significance calculating module and a bit allocating module connected to each other, wherein:

the significance calculating module is for calculating the initial value of significance of each encoding subband according to amplitude envelop values of the encoding subbands;

said bit allocating module is for carrying out the bit allocation on each frequency domain coefficient in the encoding subbands according to the significance of each encoding subband, and during the bit allocation process, the bit allocation step size and significance reduced step size after the bit allocation are variable.

Said initial value of significance is calculated according the optimal bit value in the condition of the maximum quantization signal to noise ratio gain and the scale factor suitable for the human ear perception characteristics, or to the quantitative index $Th_q(j)$ of amplitude envelop of each encoding subband or $\lfloor \mu \times \log_2[Th(j)]+v \rfloor$, wherein $\mu>0$, and both $\mu$ and $v$ are real numbers.

When said significance calculating module calculates said initial value of significance, the significance calculating module firstly calculates a bit consuming average value of single frequency domain coefficient; and then calculates an optimal bit value in the condition of the maximum quantization signal to noise ratio gain according to the code rate distortion theory; afterwards, calculates the initial value of significance in the bit allocation of each encoding subband according to said bit consuming average value and the optimal bit value;

said bit allocating module carries out the bit allocation on each encoding subband according to the significance of each encoding subband: increasing the encoded bit number of each frequency domain coefficient in the encoding subband of maximum significance, and reducing the significance of this encoding subband; until the summation of the consumed bit number of all the encoding subbands satisfies the maximum value in the condition of the available bit limitation.

When the bit allocating module carries out the bit allocation, the bit allocation step size and the significance reduced step size after the bit allocation of the low bit encoding subband are less than the bit allocation step size and the significance reduced step size after the bit allocation of the zero bit encoding subband and the high bit encoding subband. For example, when said bit allocating module carries out the bit allocation, both the bit allocation step size and the significance reduced step size after the bit allocation of the low bit encoding subband are 0.5; and the bit allocation step size and the significance reduced step size after the bit allocation of the zero bit encoding subband and the high bit encoding subband are 1.

Figure 7:
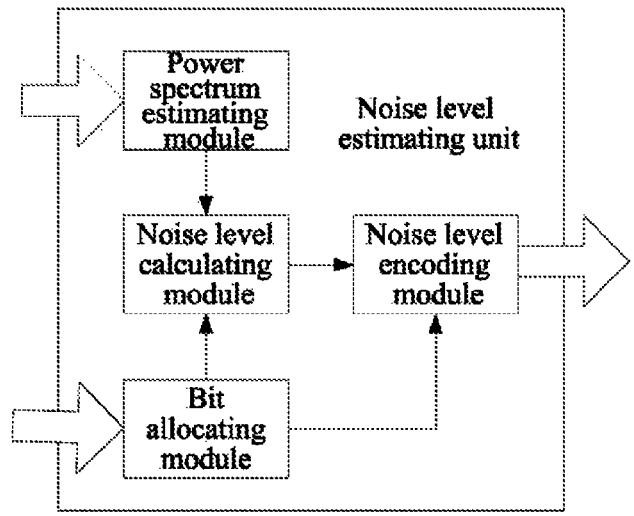
FIG. 7 is a structure schematic diagram of the modules of the noise level estimating unit according to the present invention.

The frequency domain coefficient quantizing and encoding unit, which is connected with the MDCT unit, the bit allocating unit and the amplitude envelop quantizing and encoding unit, is for carrying out the normalization, quantization and encoding processes on all the frequency domain coefficients in each encoding subband to generate the frequency domain coefficient encoded bits;

The noise level estimating unit, which is connected with the MDCT unit and the bit allocating unit, is for estimating the power spectrum of the audio signal to be encoded according to the MDCT frequency domain coefficients of the audio signal to be encoded, and further estimating the noise level of the zero bit encoding subband audio signal, and quantizing and encoding to obtain the noise level encoded bits; wherein this noise level is for controlling the energy proportion of the noise filling to the spectral band replication during decoding, detailed in FIG. 7;

Said noise level of the zero bit encoding subband audio signal refers to the ratio of the noise components power estimated in the zero bit encoding subbands to the tone components power estimated in the zero bit encoding subbands.

The bit stream multiplexer (MUX), which is connected with the amplitude envelop quantizing and encoding unit, the frequency domain coefficient encoding unit and the noise level estimating unit, is for multiplexing the encoded bits of each encoding subband and the frequency domain coefficient encoded bits and the noise level encoded bits, and sending to the decoding end.

The sequence of the bit stream multiplexer multiplexing and packaging the encoded bits is the amplitude envelop Huffman encoding flag, frequency domain coefficient Huffman encoding flag, iteration times of bit allocation and modification, the amplitude envelop encoded bits, frequency domain coefficients encoded bits, and the noise level encoded bits in sequence.

As shown in FIG. 7, the noise level estimating unit specifically comprises:

A power spectrum estimating module, which is for estimating the power spectrum of the audio signal to be encoded according to the MDCT frequency domain coefficients of the audio signal to be encoded;

said power spectrum estimating module adopts the following formula to estimate the power of the frequency point k of the ith frame:

$P_i(k)=\lambda P_{i-1}(k)+(1-\lambda)X_i(k)^2$, wherein when i is equal to 0, $P_{i-1}(k)=0$; and $P_i(k)$ denotes the estimated power value of the kth frequency point of the ith frame; and $X_i(k)$ denotes the MDCT coefficient of the kth frequency point of the ith frame, and $\lambda$ is the filtering coefficient of the unipolar smoothing filter.

A noise level calculating module, which is connected with said power spectrum estimating module, is for estimating the noise level of the audio signal of the noise filling subband to which bits are allocated according to the power spectrum estimated by said power spectrum estimating module; and A noise level encoding module, which is connected with said noise level calculating module, is for carrying out the quantization and encoding on the noise level calculated by said noise level calculating module to obtain the noise level encoded bits.

Preferably, the frequency domain coefficients of the audio signal to be encoded are divided into one or more noise filling subbands, and the functions of said noise level calculating module specifically comprises: for calculating an average value of powers of all the frequency domain coefficients of all or part of zero bit encoding subbands in this valid noise filling subband to obtain an average power $P\_aveg(j)$; for calculating an average value of powers of all of the frequency domain coefficients of which the powers $P_i(k)$ are greater than the average power $P\_aveg(j)$ of all or part of the zero bit encoding subbands in this valid noise filling subband to obtain the tone components average power P_signal_aveg(j) of the zero bit encoding subbands in this valid noise filling subband; for calculating an average value of powers $P_f(k)$ of all of the frequency domain coefficients of which the powers $P_f(k)$ are less than or equal to the average power P_aveg(j) of all or part of the zero bit encoding subbands in this valid noise filling subband to obtain the noise components average power P_noise_aveg(j) of the zero bit encoding subbands in this valid noise filling subband; and for calculating a ratio of the noise components average power P_noise_aveg(j) to the tone components average power P_signal_aveg(j) to obtain the noise level of this valid noise filling subband;

wherein the valid noise filling subband refers to the noise filling subband including the zero bit encoding subbands.

Said noise level estimating unit also comprises a bit allocating module, which is connected to the noise level calculating module and the noise level encoding module, and the bit allocating module is for allocating bits to all the valid noise filling subbands or skipping one or more low frequency valid noise filling subbands and allocating bits to subsequent higher frequency valid noise filling subbands, and notifying the noise level calculating module and the noise level encoding module; said noise level calculating module only calculates the noise level for the noise filling subbands to which bits are allocated; and said noise level encoding module adopts the bits allocated by the bit allocating module to carry out the quantization and encoding on said noise level.

4. The Decoding System

Figure 8:
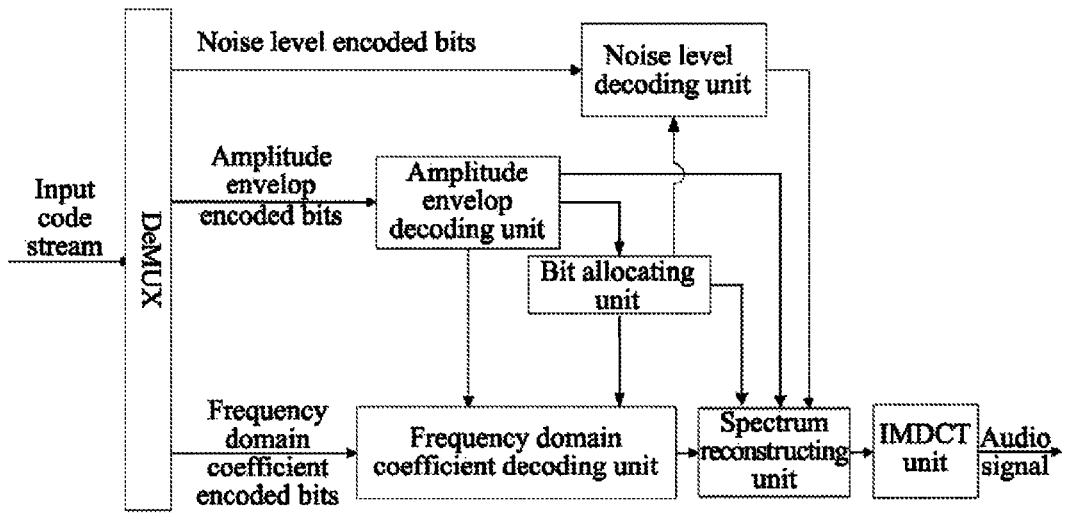
FIG. 8 is a structure schematic diagram of the system for audio decoding according to the present invention.

In order to implement the above decoding method, the present invention also provides a system for audio decoding, and as shown in FIG. 8, this system comprises: a bit stream demultiplexer (DeMUX), an encoding subband amplitude envelop decoding unit, a bit allocating unit, a frequency domain coefficient decoding unit, a spectrum reconstructing unit, and an Inverse Modified Discrete Cosine Transform (IMDCT) unit, wherein:

The bit stream demultiplexer (DeMUX), is for separating the amplitude envelop encoded bits, frequency domain coefficient encoded bits and noise level encoded bits from the bit stream to be decoded;

The amplitude envelop decoding unit, which is connected with said bit stream demultiplexer, is for decoding the amplitude envelop encoded bits outputted by said bit stream demultiplexer to obtain the amplitude envelop quantitative index of each encoding subband;

The bit allocating unit, which is connected with said amplitude envelop decoding unit, is for allocating bits to each encoding subband and allocating bits to the noise filling subbands which include zero bit encoding subbands;

The bit allocating unit comprises: the significance calculating module, bit allocating module and bit allocation and modification module, wherein:

The significance calculating module is for calculating the initial value of significance of each encoding subband according to the encoding subband amplitude envelop values;

Said bit allocating module is for carrying out bit allocation for each frequency domain coefficient in the encoding subbands according to the initial value of significance of each encoding subband, and during the process of bit allocation, the bit allocation step size and the significance reduced step size after the bit allocation are variable;

The bit allocation and modification module is for after carrying out the bit allocation, modifying the iteration times count value and the significance of each encoding subband according to the bit allocation of the encoding end, and then carrying out bit allocation and modification count times on the encoding subband.

When said bit allocating module carries out the bit allocation, the bit allocation step size and the significance reduced step size after the bit allocation of the low bit encoding subbands are less than the bit allocation step size and the significance reduced step size after the bit allocation of the zero bit encoding subbands and high bit encoding subbands.

When said bit allocation and modification module carries out the bit modification, the bit modification step size and the significance reduced step size after the bit modification of the low bit encoding subbands are less than the bit modification step size and the significance reduced step size after the bit modification of the zero bit encoding subbands and high bit encoding subbands.

When said bit allocating unit allocates bits to the noise filling subband, according to the allocating way of the encoder, the bit allocating unit allocates bits to all the valid noise filling subbands or skips one or more low frequency valid noise filling subbands and allocates bits to subsequent higher frequency valid noise filling subbands.

The frequency domain coefficient decoding unit, which is connected with the amplitude envelop decoding unit and the bit allocating unit, is for carrying out the decoding, inverse quantization and inverse normalization on the encoding subbands to obtain the frequency domain coefficients;

The noise level decoding unit, which is connected with the bit stream demultiplexer and the bit allocating unit, is for carrying out the decoding and inverse quantization for the noise level encoded bits to obtain the noise level;

The spectrum reconstructing unit, which is connected with the noise level decoding unit, the frequency domain coefficient decoding unit, the amplitude envelop decoding unit and the bit allocating unit, is for carrying out the spectral band replication on the zero bit encoding subband, and according to the amplitude envelop outputted by the amplitude envelop decoding unit, controlling the overall energy filling level of this encoding subband, and according to the noise level outputted by the noise level decoding unit, controlling the energy proportion of the noise filling to the spectral band replication, and obtaining the reconstructed frequency domain coefficient of zero bit encoding subband.

The Inverse Modified Discrete Cosine Transform (IMDCT) unit, which is connected with said spectrum reconstructing unit, is for carrying out the IMDCT on the frequency domain coefficients after completing the spectrum reconstruction of zero bit encoding subbands to obtain the audio signal.

Figure 9:
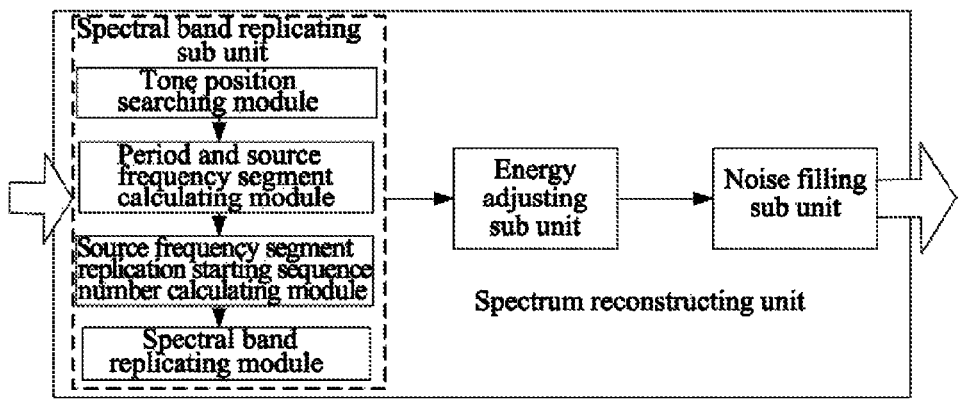
FIG. 9 is a structure schematic diagram of modules of the spectrum reconstructing unit according to the present invention.

As shown in FIG. 9, said spectrum reconstructing unit specifically comprises a spectral band replicating sub unit, an energy adjusting sub unit and a noise filling sub unit connected in sequence, wherein:

The spectral band replicating sub unit is for carrying out the spectral band replication on the zero bit encoding subbands;

The energy adjusting sub unit is for calculating the amplitude envelop of the frequency domain coefficients obtained after spectral band replication of the zero bit encoding subband, and donating it as the sbr_rms(r); and according to the noise level outputted by the noise level decoding unit, carrying out energy adjustment on the frequency domain coefficients obtained after the replication, and the frequency domain coefficients after the energy adjustment being:

$$\overline{X\_sbr}(r) = X\_sbr(r) * sbr\_lev\_scale(r) * rms(r) / sbr\_rms(r);$$

Wherein the $\overline{X\_sbr}(r)$ denotes the frequency domain coefficients after the energy adjustment of the zero bit encoding subband r, the X_sbr(r) denotes the frequency domain coefficients after the replication of the zero bit encoding subband r, the sbr_rms(r) is the amplitude envelop of the frequency domain coefficients X_sbr(r) obtained after the replication of the zero bit encoding subband r, the rms(r) is the amplitude envelop of the frequency domain coefficients before encoding of the zero bit encoding subband r, which is obtained by inversely quantizing the amplitude envelop quantitative index, and the sbr_lev_scale(r) is the energy control scale factor of the spectral band replication of the zero bit encoding subband r, of which the value is determined by the noise level of noise filling subband where the zero bit encoding subband r is located, and the specific calculation formula is as follows:

$$\text{sbr\_lev\_scale}(r) = \sqrt{(1 - \overline{\text{P\_noise\_rate}}(j)) * \text{fill\_energy\_scalefactor}}$$

The fill_energy_saclefactor is the filling energy scale factor, which is for adjusting the gain of the overall filling energy, and the value range is (0, 1), the $\overline{\text{P\_noise\_rate}}(j)$ is the noise level of the noise filling subband j obtained by decoding and inversely quantizing, wherein the j is the sequence number of noise filling subband where the zero bit encoding subband r is located.

The noise filling sub unit is for carrying out the noise filling on the frequency domain coefficients after the energy adjustment according to the noise level outputted by the noise level decoding unit, and the noise filling formula being:

$$\overline{X}(r) = \overline{X\_sbr}(r) + \text{rms}(r) * \text{noise\_lev\_scale}(r) * \text{random}(\ );$$

Wherein the $\overline{X}(r)$ denotes the reconstructed frequency domain coefficient of the zero bit encoding subband r, the $\overline{X\_sbr}(r)$ denotes the energy adjusted frequency domain coefficient of the zero bit encoding subband r, the rms(r) is the amplitude envelop of the frequency domain coefficient before encoding of the zero bit encoding subband r, which is obtained by inversely quantizing the amplitude envelop quantitative index, the random( ) is the random phase generator, which generates the random phase values and returns +1 or −1, and the noise_lev_scale(r) is the noise level control scale factor, of which the value is determined by the noise level of noise filling subband where the zero bit encoding subband r is located, and the specific operation formula is as follows:

$$\text{noise\_lev\_scale}(r) = \sqrt{\overline{\text{P\_noise\_rate}}(j) * \text{fill\_energy\_scalefactor}}$$

Wherein fill_energy_saclefactor is the filling energy scale factor, which is for adjusting the overall filling energy gain, and the value range is (0, 1), and the value is 0.2 in this example. The $\overline{\text{P\_noise\_rate}}(j)$ is the noise level of the noise filling subband j obtained by decoding and inversely quantizing, wherein j is the sequence number of noise filling subband where zero bit encoding subband r is located.

Said spectral band replicating sub unit carries out the spectral band replication on the zero bit encoding subbands in the noise filling subband to which bits are allocated according to the bit allocation result of the bit allocating unit; said energy adjusting sub unit carries out the energy adjustment on the frequency domain coefficients obtained after the spectral band replication; and said noise filling sub unit carries out the noise filling on the frequency domain coefficient after the energy adjustment and the zero bit encoding subband of the noise filling subband to which bits are not allocated.

Preferably, as shown in FIG. 9, said spectral band replicating sub unit comprises: a tone position searching module, a period and source frequency segment calculating module, a source frequency segment replication starting sequence number calculating module, and a spectral band replicating module connected in sequence, wherein:

the tone position searching module is for searching for the position of a certain tone of the audio signal in the MDCT frequency domain coefficients, specifically comprising: taking the absolute value or square value of the MDCT frequency domain coefficients of the first frequency segment, and carrying out the smoothing filtering; according to the result of the smoothing filtering, searching for the position of the maximum extreme value of the first frequency segment filtering outputs, and the position of this maximum extreme value being taken as the tone position;

the period and source frequency segment calculating module is for determining the spectral band replication period and source frequency segment for the replication according to the tone position, and this spectral band replication period is the bandwidth from the 0 frequency point to the frequency point of the tone position, and said source frequency segment is the frequency segment from the 0 frequency point shifting the spectral band replication offset copyband_offset frequency points backwards to the frequency point of tone position shifting the copyband_offset frequency points backwards;

If the sequence number of the frequency point of tone position is denoted as the Tonal_pos and the preset spectral band replication offset is denoted as the copyband_offset, then the starting sequence number of the frequency domain coefficient of the source frequency segment is the copyband_offset, and the end sequence number is the copyband_offset+Tonal_pos.

The source frequency segment replication starting sequence number calculating module is for calculating the source frequency segment replication starting sequence number of this zero bit encoding subband according to the source frequency segment and the starting sequence number of the zero bit encoding subband which requires the spectral band replication.

Said spectral band replicating module is for taking the spectral band replication period as the period, and periodically replicating the frequency domain coefficients of the source frequency segment starting from the source frequency segment replication starting sequence number to the zero bit encoding subband;

If the highest frequency inside the zero bit encoding subband which requires the spectral band replication is less than the searched-out tone frequency, then this frequency point only adopts the noise filling to carry out the spectrum reconstruction, without carrying out the spectral band replication.

Said tone position searching module adopts the following way to search for the tone position: taking the absolute value or square value of the MDCT frequency domain coefficients of the first frequency segment, and carrying out the smoothing filtering; according to the result of the smoothing filtering, searching for the position of the maximum extreme value of the first frequency segment filtering outputs, and the position of this maximum extreme value being taken as the tone position.

Preferably, The operation formula of said tone position searching module taking the absolute value of the MDCT frequency domain coefficients of the first frequency segment to carry out the smoothing filtering is:

$$X\_\text{amp}_i(k) = \mu X\_\text{amp}_{i-1}(k) + (1-\mu)|\overline{X}_i(k)|$$

Or, the operation formula of taking the square value of the frequency domain coefficients of the first frequency segment to carry out the smoothing filtering is:

$$X\_\text{amp}_i(k) = \mu X\_\text{amp}_{i-1}(k-1) + (1-\mu)\overline{X}_i(k)^2$$

Wherein µ is a smoothing filtering coefficient, and the value could be 0.125 in this example, $X\_amp_i(k)$ denotes the filtering outputs of the kth frequency point of the ith frame, and $\overline{X}_i(k)$ is the decoded MDCT coefficients of the kth frequency point of the ith frame, and when i=0, $X\_amp_{i-1}(k)=0$.

Preferably, the first frequency segment is a determined low frequency segment of which the energy is more centralized according to the spectrum statistic characteristics, wherein the low frequency refers to the spectrum components less than the half of the total bandwidth of the signal.

Preferably, said tone position searching module directly searches for the initial maximum value from the filtering outputs of the frequency domain coefficients corresponding to the first frequency segment, and this maximum value is taken as the maximum extreme value of the first frequency segment filtering outputs.

Preferably, when said tone position searching module determines the maximum extreme value of the filtering outputs, a segment in the first frequency segment is taken as the second frequency segment, and an initial maximum value is searched from the filtering outputs of the frequency domain coefficients corresponding to the second frequency segment, and according to the position of the frequency domain coefficient corresponding to this initial maximum value, different processes are carried out:

(a) if this initial maximum value is the filtering output of the frequency domain coefficient of a lowest frequency of the second frequency segment, this filtering output of the frequency domain coefficient of the lowest frequency of the second frequency segment is compared with the filtering output of the frequency domain coefficient of the former lower frequency in the first frequency segment, and compared forwards in sequence, until the filtering output of the current frequency domain coefficient is greater than the filtering output of the former frequency domain coefficient, and the filtering output of the current frequency domain coefficient is a finally determined maximum extreme value, or, until the filtering output of the frequency domain coefficient of the lowest frequency of the first frequency segment is greater than the filtering output of the latter frequency domain coefficient by comparing, and the filtering output of the frequency domain coefficient of the lowest frequency of the first frequency segment is the finally determined maximum extreme value;

(b) if this initial maximum value is the filtering output of the frequency domain coefficient of a highest frequency of the second frequency segment, this filtering output of the frequency domain coefficient of the highest frequency of the second frequency segment is compared with the filtering output of the frequency domain coefficient of the latter higher frequency in the first frequency segment, and compared backwards in sequence, until the filtering output of the current frequency domain coefficient is greater than the filtering output of the latter frequency domain coefficient, and the filtering output of the current frequency domain coefficient is the finally determined maximum extreme value, or, until the filtering output of the frequency domain coefficient of a highest frequency of the first frequency segment is greater than the filtering output of the former frequency domain coefficient by comparing, and the filtering output of the frequency domain coefficient of the highest frequency of the first frequency segment is the finally determined maximum extreme value;

(c) if this initial maximum value is the filtering output of the frequency domain coefficient between the lowest frequency and the highest frequency in the second frequency segment, the frequency domain coefficient corresponding to this initial maximum value is the position of tone, namely, this initial maximum value is the finally determined maximum extreme value.

Preferably, the process of said source frequency segment replication starting sequence number calculating module calculating the source frequency segment replication starting sequence number of this zero bit encoding subband which requires the spectral band replication comprises: obtaining the sequence number of the start frequency point of the zero bit encoding subband which requires reconstructing the frequency domain coefficient, which is denoted as the fillband_start_freq, and the sequence number of the frequency point corresponding to the tone being denoted as the Tonal_pos, and adding the Tonal_pos by 1 to obtain the replication period copy_period, and the starting sequence number of source frequency segment being denoted as the copyband_offset, and the value of the fillband_start_freq circularly subtracting the copy_period until the value falls into the value range of the sequence number of source frequency segment, and this value being denoted as the copy_pos_mod, which is the source frequency segment replication starting sequence number.

Preferably, when said spectral band replicating module carrying out the spectral band replication, it specifically comprises:
the frequency domain coefficients starting from the source frequency segment replication starting sequence number are replicated backwards in sequence to the zero bit encoding subband starting from the fillband_start_freq, until the frequency point of the source frequency segment replication arrives at the frequency point Tonal_pos+copyband_offset, and the frequency domain coefficients starting from the copyband_offset th frequency point are continually replicated backwards to this zero bit encoding subband over again, and the rest may be deduced by analogy, until completing all the frequency domain coefficients replication of the current zero bit encoding subband.

What is claimed is:
1. A method for estimating a noise level, comprising:
estimating a power spectrum of an audio signal to be encoded according to a frequency domain coefficient of the audio signal to be encoded; and
estimating a noise level of a zero bit encoding subband audio signal according to the power spectrum obtained by calculating, this noise level being used for controlling an energy proportion of noise filling to spectral band replication during decoding; wherein a zero bit encoding subband refers to an encoding subband of which allocated bit number is zero.

2. The method of claim 1, wherein said noise level of the zero bit encoding subband audio signal refers to a ratio of a noise components power estimated in the zero bit encoding subband to a tone components power estimated in the zero bit encoding subband.

3. The method of claim 1, wherein
the power spectrum of the audio signal to be encoded is estimated according to a MDCT frequency domain coefficient of the audio signal to be encoded, and a power calculation formula for a frequency point k of the ith frame is as follows:
$P_i(k)=\lambda P_{i-1}(k)+(1-\lambda)X_i(k)^2$, wherein when i is equal to 0, $P_{i-1}(k)=0$; the $P_i(k)$ denotes a power value estimated in the kth frequency point of the ith frame; the $X_i(k)$ denotes a MDCT coefficient in the kth frequency point of the ith frame, and the $\lambda$ is a filtering coefficient of an unipolar smoothing filter.

4. The method of claim 1, wherein frequency domain coefficients of the audio signal to be encoded are divided into one or more noise filling subbands, and a process of calculating the noise level of a certain valid noise filling subband according to the estimated power spectrum of the audio signal to be encoded comprises:

calculating an average value of powers of all the frequency domain coefficients of all or part of zero bit encoding subbands in this valid noise filling subband to obtain an average power P_aveg(j);

calculating an average value of powers of all the frequency domain coefficients, of which the powers $P_i(k)$ are greater than the average power P_aveg(j), of all or part of the zero bit encoding subbands in this valid noise filling subband, to obtain a tone components average power P_signal_aveg(j) of the zero bit encoding subbands in this valid noise filling subband;

calculating an average value of powers $P_i(k)$ of all the frequency domain coefficients, of which the powers $P_i(k)$ are less than or equal to the average power P_aveg (j), of all or part of the zero bit encoding subbands in this valid noise filling subband, to obtain a noise components average power P_noise_aveg(j) of the zero bit encoding subbands in this valid noise filling subband; and calculating a ratio P_noise_rate(j) of the noise components average power P_noise_aveg(j) to the tone components average power P_signal_aveg(j) to obtain the noise level of this valid noise filling subband, wherein the valid noise filling subband refers to the noise filling subband including zero bit encoding subbands.

5. A method for audio encoding, comprising:

A. dividing MDCT frequency domain coefficients of an audio signal to be encoded into a plurality of encoding subbands, and carrying out quantization and encoding on an amplitude envelop value of each encoding subband to obtain amplitude envelop encoded bits;

B. carrying out bit allocation for each encoding subband, and carrying out quantization and encoding on non-zero bit encoding subbands to obtain MDCT frequency domain coefficient encoded bits;

C. estimating a power spectrum of the audio signal to be encoded according to the MDCT frequency domain coefficients of the audio signal to be encoded, and estimating a noise level of a zero bit encoding subband audio signal, and quantizing and encoding the noise level to obtain noise level encoded bits; wherein this noise level is used for controlling an energy proportion of noise filling to spectral band replication during decoding, and the zero bit encoding subband refers to an encoding subband of which allocated bit number is zero; and D. after multiplexing and packaging amplitude envelop encoded bits of each encoding subband and frequency domain coefficient encoded bits and noise level encoded bits, sending to a decoding end.

6. The method of claim 5, wherein in step B, the frequency domain coefficients of the audio signal to be encoded are divided into one or more noise filling subbands, and after allocating bits to each encoding subband, bits are allocated to valid noise filling subbands; in step C, a process of calculating the noise level of a certain valid noise filling subband according to the estimated power spectrum of the audio signal to be encoded comprises:

calculating an average value of powers of all the frequency domain coefficients of all or part of zero bit encoding subbands in this valid noise filling subband to obtain an average power P_aveg(j);

calculating an average value of powers of all the frequency domain coefficients, of which the powers $P_i(k)$ are greater than the average power P_aveg(j), of all or part of the zero bit encoding subbands in this valid noise filling subband, to obtain a tone components average power P_signal_aveg(j) of the zero bit encoding subbands in this valid noise filling subband;

calculating an average value of powers $P_i(k)$ of all the frequency domain coefficients, of which the powers $P_i(k)$ are less than or equal to the average power P_aveg (j), of all or part of the zero bit encoding subbands in this valid noise filling subband, to obtain a noise components average power P_noise_aveg(j) of the zero bit encoding subbands in this valid noise filling subband; and calculating a ratio P_noise_rate(j) of the noise components average power P_noise_aveg(j) to the tone components average power P_signal_aveg(j) to obtain the noise level of this valid noise filling subband, wherein the valid noise filling subband refers to the noise filling subband including zero bit encoding subbands.

7. The method of claim 6, wherein in step B, bits are allocated to all the valid noise filling subbands, or one or more low frequency valid noise filling subbands are skipped and bits are allocated to subsequent higher frequency valid noise filling subbands; in step C, the noise level of the valid noise filling subbands to which bits are allocated is calculated; and in step D, these allocated bits are used in multiplexing and packaging the noise level encoded bits.

8. A method for audio decoding, comprising:

A2. carrying out decoding and inverse quantization on each amplitude envelop encoded bit in a bit stream to be decoded to obtain an amplitude envelop of each encoding subband;

B2. carrying out bit allocation on each encoding subband, carrying out decoding and inverse quantization on noise level encoded bits to obtain a noise level of a zero bit encoding subband, and carrying out decoding and inverse quantization on frequency domain coefficient encoded bits to obtain frequency domain coefficients of a non-zero bit encoding subband;

C2. carrying out spectral band replication on zero bit encoding subbands, and according to the amplitude envelop of each zero bit encoding subband, controlling an overall energy filling level of this encoding subband, and according to the noise level of this zero bit encoding subband, controlling an energy proportion of noise filling to spectral band replication, to obtain reconstructed frequency domain coefficients of zero bit encoding subbands; and D2. carrying out an Inverse Modified Discrete Cosine Transform (IMDCT) on frequency domain coefficients of non-zero bit encoding subbands and reconstructed frequency domain coefficients of zero bit encoding subbands to obtain a final audio signal.

9. The method of claim 8, wherein in step C2, during spectral band replication, position of a certain tone of the audio signal is searched in MDCT frequency domain coefficients, a bandwidth from 0 frequency point to a frequency point of the tone position is taken as a spectral band replication period, and a frequency segment from a frequency point of the 0 frequency point shifting copyband_offset frequency points backwards to a frequency point of the frequency point of the tone position shifting the copyband_offset frequency points backwards is taken as a source frequency segment, to carry out the spectral band replication on a zero bit encoding subband, if the highest frequency inside the zero bit encoding subband is less than the frequency of the searched tone, then this zero bit encoding subband only adopts noise filling to carry out spectrum reconstruction.

10. The method of claim 9, wherein in step C2, when the spectral band replication is carried out for a zero bit encoding subband, a source frequency segment replication starting sequence number of this zero bit encoding subband is calculated according to the source frequency segment and a starting sequence number of the zero bit encoding subband which requires spectral band replication, and then the spectral band replication period is taken as a period, and starting from the source frequency segment replication starting sequence number, frequency domain coefficients of the source frequency segment are periodically replicated to the zero bit encoding subband.

11. The method of claim 8, wherein in step C2, energy adjustment on frequency domain coefficients obtained after zero bit encoding subband replication is carried out by adopting the following method:

calculating an amplitude envelop of frequency domain coefficients obtained after spectral band replication of the zero bit encoding subband, the amplitude envelop being denoted as sbr_rms(r);

a formula for the energy adjustment on frequency domain coefficients obtained after replication being:

$$\overline{X\_sbr}(r) = X\_sbr(r) * sbr\_lev\_scale(r) * rms(r)/sbr\_rms(r);$$

wherein the $\overline{X\_sbr}(r)$ denotes the frequency domain coefficient after the energy adjustment of the zero bit encoding subband r, the X_sbr(r) denotes the frequency domain coefficient obtained after the replication of the zero bit encoding subband r, the sbr_rms(r) is the amplitude envelop of the frequency domain coefficients X_sbr(r) obtained after the replication of the zero bit encoding subband r, the rms(r) is the amplitude envelop of the frequency domain coefficients before encoding of the zero bit encoding subband r, and the rms(r) is obtained by inversely quantizing an amplitude envelop quantitative index, the sbr_lev_scale(r) is an energy control scale factor of the spectral band replication of the zero bit encoding subband r, the value of the sbr_lev_scale(r) is determined by the noise level of the noise filling subband where the zero bit encoding subband r is located, and a calculation formula of the sbr_lev_scale(r) is as follows:

$$sbr\_lev\_scale(r) = \sqrt{(1 - \overline{P\_noise\_rate}(j)) * fill\_energy\_scalefactor}$$

the fill_energy_saclefactor is a filling energy scale factor for adjusting an overall filling energy gain, a value range of the fill_energy_saclefactor is (0, 1), and the P_noise_rate(j) is the noise level of a noise filling subband j obtained by decoding and inverse quantization, wherein the j is the sequence number of the noise filling subband where the zero bit encoding subband r is located.

12. The method of claim 8, wherein in step C2, noise filling on frequency domain coefficients after energy adjustment is carried out according to the following formula:

$$\overline{X}(r) = \overline{X\_sbr}(r) + rms(r) * noise\_lev\_scale(r) * random(\ );$$

wherein the $\overline{X}(r)$ denotes a reconstructed frequency domain coefficient of a zero bit encoding subband r, the $\overline{X\_sbr}(r)$ denotes a frequency domain coefficient after energy adjustment of the zero bit encoding subband r, the rms(r) is the amplitude envelop of the frequency domain coefficients before encoding of the zero bit encoding subband r, and the rms(r) is obtained by inversely quantizing an amplitude envelop quantitative index, the random( ) is a random phase generator, which generates random phase values and returns +1 or −1, the noise_lev_scale(r) is a noise level control scale factor of the zero bit encoding subband r, the value of the noise_lev_scale(r) is determined by the noise level of the noise filling subband where the zero bit encoding subband r is located, and a calculation formula of the noise_lev_scale(r) is as follows:

$$noise\_lev\_scale(r) = \sqrt{\overline{P\_noise\_rate}(j) * fill\_energy\_scalefactor}$$

wherein the fill_energy_saclefactor is a filling energy scale factor for adjusting an overall filling energy gain, a value range of the fill_energy_saclefactor is (0, 1), and the $\overline{P\_noise\_rate}(j)$ is the noise level of a noise filling subband j obtained by decoding and inverse quantization, wherein j is the sequence number of the noise filling subband where the zero bit encoding subband r is located.

13. The method of claim 9, wherein in step B2, after bit allocation is carried out for each encoding subband, encoding subbands are divided into a plurality of noise filling subbands, and bit allocation is carried out for valid noise filling subbands, and in step C2, spectral band replication is carried out for zero bit encoding subbands in the valid noise filling subbands to which bits are allocated and an energy level of replicated frequency domain coefficients and an energy level of noise filling are controlled, and noise filling is carried out for zero bit encoding subbands in an valid noise filling subband to which bits are not allocated, wherein the valid noise filling subband refers to a noise filling subband including the zero bit encoding subband.

14. A system for audio encoding, comprising a Modified Discrete Cosine Transform (MDCT) unit, an amplitude envelop calculating unit, an amplitude envelop quantizing and encoding unit, a bit allocating unit, a frequency domain coefficient encoding unit and a bit stream multiplexer (MUX), and further comprising a noise level estimating unit, wherein the MDCT unit is for carrying out Inverse Modified Discrete Cosine Transform on an audio signal to transform and generate frequency domain coefficients;

the amplitude envelop calculating unit, which is connected with said MDCT unit, is for dividing frequency domain coefficients generated by said MDCT into a plurality of encoding subbands, and calculating an amplitude envelop value of each encoding subband;

the amplitude envelop quantizing and encoding unit, which is connected with said amplitude envelop calculating unit, is for carrying out quantization and encoding on the amplitude envelop value of each encoding subband, and generating encoded bits of amplitude envelop of each encoding subband;

the bit allocating unit, which is connected with said amplitude envelop quantizing and encoding unit, is for allocating bits to each encoding subband;

the frequency domain coefficient quantizing and encoding unit, which is connected with the MDCT unit, bit allocating unit, and amplitude envelop quantizing and encoding unit, is for carrying out normalization, quantization and encoding processes on all frequency domain coefficients of each encoding subband to generate frequency domain coefficient encoded bits;

the noise level estimating unit, which is connected with the MDCT unit and bit allocating unit, is for estimating a power spectrum of an audio signal to be encoded according to the MDCT frequency domain coefficients of the audio signal to be encoded, and estimating a noise level of a zero bit encoding subband audio signal, and quantizing and encoding to obtain noise level encoded bits; wherein this noise level is used for controlling an energy proportion of noise filling to spectral band replication when decoding;

the bit stream multiplexer (MUX), which is connected with said amplitude envelop quantizing and encoding unit, frequency domain coefficient encoding unit and noise level estimating unit, is for multiplexing encoded bits of each encoding subband and frequency domain coefficient encoded bits, and sending to a decoding end.

15. The system of claim 14, wherein said noise level estimating unit comprises:

a power spectrum estimating module, which is for estimating the power spectrum of the audio signal to be encoded according to the MDCT frequency domain coefficients of the audio signal to be encoded, a noise level calculating module, which is connected with said power spectrum estimating module, is for estimating the noise level of the zero bit encoding subband audio signal according to the power spectrum estimated by said power spectrum estimating module; and a noise level encoding module, which is connected with said noise level calculating module, is for carrying out quantization and encoding on the noise level calculated by said noise level calculating module to obtain noise level encoded bits.

16. The system of claim 15, wherein said power spectrum estimating module adopts the following formula to estimate a power of a frequency point k of the ith frame, and the formula is as follows:

$P_i(k)=\lambda P_{i-1}(k)+(1-\lambda)X_i(k)^2$, wherein when i is equal to 0, $P_{i-1}(k)=0$; the $P_i(k)$ denotes a power value estimated in the kth frequency point of the ith frame; the $X_i(k)$ denotes a MDCT coefficient in the kth frequency point of the ith frame, and the $\lambda$ is a filtering coefficient of an unipolar smoothing filter.

17. The system of claim 15, wherein the frequency domain coefficients of the audio signal to be encoded are divided into one or more noise filling subbands, and the function of said noise level calculating module comprises: calculating an average value of powers of all the frequency domain coefficients of all or part of zero bit encoding subbands in the valid noise filling subband to obtain an average power P_aveg(j); calculating an average value of powers of all the frequency domain coefficients, of which the powers $P_i(k)$ are greater than the average power P_aveg(j), of all or part of the zero bit encoding subbands in the valid noise filling subband, to obtain a tone components average power P_signal_aveg(j) of the zero bit encoding subbands in the valid noise filling subband; calculating an average value of powers $P_i(k)$ of all the frequency domain coefficients, of which the powers $P_i(k)$ are less than or equal to the average power P_aveg(j), of all or part of the zero bit encoding subbands in the valid noise filling subband, to obtain a noise components average power P_noise_aveg(j) of the zero bit encoding subbands in the valid noise filling subband; and calculating a ratio of the noise components average power P_noise_aveg(j) to the tone components average power P_signal_aveg(j) to obtain the noise level of the valid noise filling subband, wherein the valid noise filling subband refers to the noise filling subband including zero bit encoding subbands.

18. The system of claim 15, wherein said noise level estimating unit also comprises a bit allocating module connected with the noise level calculating module and noise level encoding module, and the bit allocating module is for allocating bits to all valid noise filling subbands, or skipping one or more low frequency valid noise filling subbands and allocating bits to subsequent higher frequency valid noise filling subbands, and notifying the noise level calculating module and noise level encoding module; the noise level calculating module only calculates the noise level for the noise filling subbands to which bits are allocated; and said noise level encoding module uses the bits allocated by said bit allocating module to carry out quantization and encoding on said noise level.

19. A system for audio decoding, comprising a bit stream demultiplexer (DeMUX), an encoding subband amplitude envelop decoding unit, a bit allocating unit, a frequency domain coefficient decoding unit, a spectrum reconstructing unit, and an Inverse Modified Discrete Cosine Transform (IMDCT) unit, wherein said DeMUX is for separating amplitude envelop encoded bits, frequency domain coefficient encoded bits and noise level encoded bits from a bit stream to be decoded;

said amplitude envelop decoding unit, which is connected with the DeMUX, is for carrying out decoding on amplitude envelop encoded bits outputted by said bit stream demultiplexer to obtain an amplitude envelop quantitative index of each encoding subband;

said bit allocating unit, which is connected with said amplitude envelop decoding unit, is for carrying out bit allocation to obtain the number of encoded bits allocated to each frequency domain coefficient of each encoding subband;

the frequency domain coefficient decoding unit, which is connected with the amplitude envelop decoding unit and the bit allocating unit, is for carrying out decoding, inverse quantization and inverse normalization on the encoding subband to obtain frequency domain coefficients;

the noise level decoding unit, which is connected with said bit stream demultiplexer and bit allocating unit, is for carrying out decoding and inverse quantization on the noise level encoded bits to obtain a noise level;

said spectrum reconstructing unit, which is connected with said noise level decoding unit, frequency domain coefficient decoding unit, amplitude envelop decoding unit and bit allocating unit, is for carrying out spectral band replication on zero bit encoding subbands, controlling an overall energy filling level of the encoding subband according to the amplitude envelop outputted by the amplitude envelop decoding unit, and controlling an energy proportion of noise filling to spectral band replication according to the noise level outputted by the noise level decoding unit, to obtain reconstructed frequency domain coefficients of zero bit encoding subbands;

the IMDCT unit, which is connected with said spectrum reconstructing unit, is for carrying out the IMDCT on frequency domain coefficients after spectrum reconstruction of zero bit encoding subbands to obtain an audio signal.

20. The system of claim 19, wherein
said spectrum reconstructing unit comprises a spectral band replicating sub unit, an energy adjusting sub unit and a noise filling sub unit connected in sequence, wherein
the spectral band replicating sub unit is for carrying out spectral band replication on zero bit encoding subbands;
the energy adjusting sub unit is for calculating an amplitude envelop of frequency domain coefficients obtained after the spectral band replication of the zero bit encoding subband, the amplitude envelop being denoted as sbr_rms(r); and carrying out energy adjustment on frequency domain coefficients obtained after replication according to the noise level outputted by the noise level decoding unit, the formula of energy adjustment being:

$$\overline{X\_sbr}(r) = X\_sbr(r) * sbr\_lev\_scale(r) * rms(r)/sbr\_rms(r);$$

wherein the $\overline{X\_sbr}(r)$ denotes the frequency domain coefficient after the energy adjustment of a zero bit encoding subband r, the X_sbr(r) denotes the frequency domain coefficient obtained after the replication of the zero bit encoding subband r, the sbr_rms(r) is the amplitude envelop of the frequency domain coefficients X_sbr(r) obtained after the replication of the zero bit encoding subband r, the rms(r) is the amplitude envelop of the frequency domain coefficients before encoding of the zero bit encoding subband r, and the rms(r) is obtained by inversely quantizing the amplitude envelop quantitative index, the sbr_lev_scale(r) is an energy control scale factor of the spectral band replication of the zero bit encoding subband r, the value of the sbr_lev_scale(r) is determined by the noise level of the noise filling subband where the zero bit encoding subband r is located, and a calculation formula of the sbr_lev_scale(r) is as follows:

$$sbr\_lev\_scale(r) = \sqrt{(1 - \overline{P\_noise\_rate}(j)) * fill\_energy\_scalefactor}$$

the fill_energy_saclefactor is a filling energy scale factor for adjusting an overall filling energy gain, a value range of the fill_energy_saclefactor is (0, 1), and the $\overline{P\_noise\_rate}(j)$ is the noise level of the noise filling subband j obtained by decoding and inverse quantization, wherein the j is the sequence number of the noise filling subband where the zero bit encoding subband r is located;
the noise filling sub unit is for carrying out noise filling on frequency domain coefficients after energy adjustment according to the noise level outputted by the noise level decoding unit, the noise filling formula being:

$$\overline{X}(r) = \overline{X\_sbr}(r) + rms(r) * noise\_lev\_scale(r) * random(\ );$$

wherein the $\overline{X}(r)$ denotes a reconstructed frequency domain coefficient of a zero bit encoding subband r, the $\overline{X\_sbr}(r)$ denotes a replicated frequency domain coefficient after the energy adjustment of the zero bit encoding subband r, the rms(r) is the amplitude envelop of the frequency domain coefficients before encoding of the zero bit encoding subband r, and the rms(r) is obtained by inversely quantizing the amplitude envelop quantitative index, the random( ) is a random phase generator, which generates random phase values and returns +1 or −1, the noise_lev_scale(r) is the noise level control scale factor of the zero bit encoding subband r, a value of the noise_lev_scale(r) is determined by the noise level of the noise filling subband where the zero bit encoding subband r is located, and a calculation formula of the noise_lev_scale(r) is as follows:

$$noise\_lev\_scale(r) = \sqrt{\overline{P\_noise\_rate}(j) * fill\_energy\_scalefactor}$$

wherein the fill_energy_saclefactor is a filling energy scale factor for adjusting an overall filling energy gain, a value range of the fill_energy_saclefactor is (0, 1), and the $\overline{P\_noise\_rate}(j)$ is the noise level of the noise filling subband j obtained by decoding and inverse quantization, wherein j is the sequence number of the noise filling subband where zero bit encoding subband r is located.

21. The system of claim 19, wherein
said spectral band replicating sub unit comprises a tone position searching module, a period and source frequency segment calculating module, a source frequency segment replication starting sequence number calculating module and a spectral band replicating module connected in sequence, wherein
the tone position searching module is for searching for the position of a certain tone of the audio signal in MDCT frequency domain coefficients;
the period and source frequency segment calculating module is for determining a spectral band replication period and source frequency segment for replication according to the tone position, this spectral band replication period is a bandwidth from 0 frequency point to a frequency point of the tone position, and said source frequency segment is a frequency segment from a frequency point of the 0 frequency point shifting spectral band replication offset copyband_offset frequency points backwards to a frequency point of the frequency point of the tone position shifting the copyband_offset frequency points backwards;
the source frequency segment replication starting sequence number calculating module is for calculating the source frequency segment replication starting sequence number of the zero bit encoding subband according to the source frequency segment and a starting sequence number of the zero bit encoding subband which requires the spectral band replication;
the spectral band replicating module is for taking the spectral band replication period as a period, starting from the source frequency segment replication starting sequence number, periodically replicating frequency domain coefficients of the source frequency segment to the zero bit encoding subband; if the highest frequency inside the zero bit encoding subband is less than the frequency of the searched tone, then this frequency point only adopts noise filling to carry out spectrum reconstruction.

22. The system of claim 19, wherein said bit allocating unit is also for allocating bits to all valid noise filling subbands, or skipping one or more low frequency valid noise filling subbands and allocating bits to subsequent higher frequency valid noise filling subbands; said energy adjusting sub unit carries out energy adjustment on frequency domain coefficients obtained after spectral band replication; and said noise filling sub unit carries out noise filling on frequency domain coefficients after energy adjustment and the zero bit encoding subband of the noise filling subband to which bits are not allocated.

* * * * *

UNITED STATES PATENT AND TRADEMARK OFFICE
CERTIFICATE OF CORRECTION

PATENT NO. : 8,731,949 B2
APPLICATION NO. : 13/173367
DATED : May 20, 2014
INVENTOR(S) : Dongping Jiang et al.

It is certified that error appears in the above-identified patent and that said Letters Patent is hereby corrected as shown below:

In the Specification

Column 7, Line 5:

In the below equation, delete "*fill_energy_saclefactor" and insert
-- "*fill_energy_scalefactor --

$$sbr\_lev\_scale(r) = \sqrt{(1 - \overline{P\_noise\_rate(j)}) * fill\_energy\_saclefactor}$$

Column 7, Line 6:

delete "fill_energy_saclefactor" and insert -- fill_energy_scalefactor --

Column 7, Line 40:

In the below equation, delete "*fill_energy_saclefactor" and insert
-- "*fill_energy_scalefactor --

$$noise\_lev\_scale(r) = \sqrt{\overline{P\_noise\_rate(j)} * fill\_energy\_saclefactor}$$

Column 7, Line 41:

delete "fill_energy_saclefactor" and insert -- fill_energy_scalefactor --

Column 10, Line 52:

In the below equation, delete "*fill_energy_saclefactor" and insert
-- "*fill_energy_scalefactor --

Signed and Sealed this
Ninth Day of September, 2014

Michelle K. Lee
*Deputy Director of the United States Patent and Trademark Office*

CERTIFICATE OF CORRECTION (continued)
U.S. Pat. No. 8,731,949 B2

$$\text{sbr\_lev\_scale(r)} = \sqrt{\left(1 - \overline{P\_noise\_rate(j)}\right) * \text{fill\_energy\_saclefactor}}$$

Column 10, Line 55:
delete "fill_energy_saclefactor" and insert -- fill_energy_scalefactor --

Column 11, Line 19:
In the below equation, delete "*fill_energy_saclefactor" and insert
-- "*fill_energy_scalefactor --

$$\text{noise\_lev\_scale(r)} = \sqrt{\overline{P\_noise\_rate(j)} * \text{fill\_energy\_saclefactor}}$$

Column 11, Line 20:
delete "fill_energy_saclefactor" and insert -- fill_energy_scalefactor --

Column 32, Line 59:
delete "fill_energy_saclefactor" and insert -- fill_energy_scalefactor --

Column 33, Line 41:
delete "fill_energy_saclefactor" and insert -- fill_energy_scalefactor --

Column 39, Line 16:
delete "fill_energy_saclefactor" and insert -- fill_energy_scalefactor --

Column 39, Line 46:
delete "fill_energy_saclefactor" and insert -- fill_energy_scalefactor --

In the Claims

Column 45, Line 53, Claim 11:
delete "fill_energy_saclefactor" and insert -- fill_energy_scalefactor --

Column 45, Line 55, Claim 11:
delete "fill_energy_saclefactor" and insert -- fill_energy_scalefactor --

CERTIFICATE OF CORRECTION (continued)
U.S. Pat. No. 8,731,949 B2

Column 46, Line 20, Claim 12:

delete "fill_energy_saclefactor" and insert -- fill_energy_scalefactor --

Column 46, Line 22, Claim 12:

delete "fill_energy_saclefactor" and insert -- fill_energy_scalefactor --

Column 49, Line 39, Claim 20:

delete "fill_energy_saclefactor" and insert -- fill_energy_scalefactor --

Column 49, Line 41, Claim 20:

delete "fill_energy_saclefactor" and insert -- fill_energy_scalefactor --

Column 50, Line 9, Claim 20:

delete "fill_energy_saclefactor" and insert -- fill_energy_scalefactor --

Column 50, Line 11, Claim 20:

delete "fill_energy_saclefactor" and insert -- fill_energy_scalefactor --